(12) United States Patent
Li et al.

(10) Patent No.: US 8,877,094 B2
(45) Date of Patent: *Nov. 4, 2014

(54) YELLOW-GREEN TO YELLOW-EMITTING PHOSPHORS BASED ON HALOGENATED-ALUMINATES

(71) Applicant: Intematix Corporation, Fremont, CA (US)

(72) Inventors: Yi-Qun Li, Danville, CA (US); Jingtao Gu, Shanghai (CN); Zhankun Jia, Changchun (CN); Shifan Cheng, Dublin, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/931,214

(22) Filed: Jun. 28, 2013

(65) Prior Publication Data

US 2013/0341662 A1   Dec. 26, 2013

Related U.S. Application Data

(63) Continuation of application No. 13/415,623, filed on Mar. 8, 2012, now Pat. No. 8,475,683, which is a continuation-in-part of application No. 13/181,226, filed on Jul. 12, 2011, now Pat. No. 8,529,791, which is a continuation-in-part of application No. 11/975,356, filed on Oct. 18, 2007, now Pat. No. 8,133,461.

(60) Provisional application No. 61/450,310, filed on Mar. 8, 2011, provisional application No. 61/364,321, filed on Jul. 14, 2010, provisional application No. 60/853,382, filed on Oct. 20, 2006.

(51) Int. Cl.
C09K 11/08 (2006.01)
C09K 11/77 (2006.01)
H01L 33/50 (2010.01)

(52) U.S. Cl.
CPC .......... H01L 33/502 (2013.01); C09K 11/7734 (2013.01); C09K 11/0883 (2013.01); C09K 11/7774 (2013.01)
USPC .................................................. 252/301.4 H

(58) Field of Classification Search
None
See application file for complete search history.

(56) References Cited

U.S. PATENT DOCUMENTS 5,037,577 A    8/1991  Yamanoi et al.
5,600,202 A    2/1997  Yamada et al.
(Continued)

FOREIGN PATENT DOCUMENTS

CN    1254747    5/2000
CN    1629251    6/2005
(Continued)

OTHER PUBLICATIONS

Kuru, et al., "Yttrium Aluminum Garnet as a Scavenger for Ca and Si", J. of the American Ceramic Soc., 2008, vol. 91, No. 11, pp. 3663-3667.

(Continued)

Primary Examiner — Melvin C Mayes
Assistant Examiner — Stefanie Cohen
(74) Attorney, Agent, or Firm — David H. Jaffer; Pillsbury Winthrop Shaw Pittman LLP

(57) ABSTRACT

Disclosed herein are yellow-green and yellow-emitting aluminate based phosphors for use in white LEDs, general lighting, and LED and backlighting displays. In one embodiment of the present invention, the cerium-activated, yellow-green to yellow-emitting aluminate phosphor comprises the rare earth lutetium, at least one alkaline earth metal, aluminum, oxygen, at least one halogen, and at least one rare earth element other than lutetium, wherein the phosphor is configured to absorb excitation radiation having a wavelength ranging from about 380 nm to about 480 nm, and to emit light having a peak emission wavelength ranging from about 550 nm to about 600 nm.

21 Claims, 12 Drawing Sheets

(56) References Cited

U.S. PATENT DOCUMENTS

| | | | |
|---|---|---|---|
| 5,998,925 A | 12/1999 | Shimizu et al. | |
| 6,013,199 A | 1/2000 | McFarland et al. | |
| 6,069,440 A | 5/2000 | Shimizu et al. | |
| 6,245,259 B1 | 6/2001 | Hohn et al. | |
| 6,409,938 B1 | 6/2002 | Comanzo | |
| 6,577,073 B2 | 6/2003 | Shimizu et al. | |
| 6,669,866 B1 | 12/2003 | Kummer et al. | |
| 6,869,544 B2 | 3/2005 | Chen et al. | |
| 7,029,602 B2 | 4/2006 | Oshio | |
| 7,267,786 B2 | 9/2007 | Fiedler et al. | |
| 7,311,858 B2 | 12/2007 | Wang et al. | |
| 7,521,862 B2 | 4/2009 | Mueller et al. | |
| 7,573,072 B2 | 8/2009 | Setlur et al. | |
| 7,575,697 B2 | 8/2009 | Li et al. | |
| 7,753,553 B2 | 7/2010 | Justel et al. | |
| 8,475,683 B2 * | 7/2013 | Li et al. | 252/301.4 R |
| 2003/0001495 A1 | 1/2003 | Liu et al. | |
| 2003/0203205 A1 | 10/2003 | Bi et al. | |
| 2004/0000862 A1 | 1/2004 | Setlur et al. | |
| 2004/0084655 A1 | 5/2004 | Vartuli et al. | |
| 2004/0173807 A1 | 9/2004 | Tian et al. | |
| 2004/0256974 A1 | 12/2004 | Mueller-Mach et al. | |
| 2005/0092408 A1 | 5/2005 | Lauf et al. | |
| 2005/0093442 A1 | 5/2005 | Setlur et al. | |
| 2005/0141240 A1 | 6/2005 | Hata et al. | |
| 2005/0142240 A1 | 6/2005 | Chiu et al. | |
| 2005/0145868 A1 | 7/2005 | Kummer et al. | |
| 2005/0242329 A1 | 11/2005 | Fiedler et al. | |
| 2006/0083694 A1 | 4/2006 | Kodas et al. | |
| 2006/0158097 A1 | 7/2006 | Juestel et al. | |
| 2006/0164005 A1 | 7/2006 | Sun | |
| 2008/0018235 A1 | 1/2008 | Wang et al. | |
| 2008/0116786 A1 | 5/2008 | Wang et al. | |
| 2008/0138268 A1 | 6/2008 | Tao et al. | |
| 2008/0203892 A1 | 8/2008 | Schmidt et al. | |
| 2008/0231171 A1 | 9/2008 | Schmidt et al. | |
| 2008/0296596 A1 | 12/2008 | Setlur et al. | |
| 2009/0008663 A1 | 1/2009 | Shimizu et al. | |
| 2009/0066221 A1 | 3/2009 | Schmidt et al. | |
| 2009/0072255 A1 | 3/2009 | Takahashi et al. | |
| 2009/0072710 A1 | 3/2009 | Schmidt et al. | |
| 2009/0174310 A1 | 7/2009 | Vogt et al. | |
| 2009/0212314 A1 | 8/2009 | Im et al. | |
| 2010/0059681 A1 | 3/2010 | Nakamura et al. | |
| 2010/0085728 A1 | 4/2010 | Seto et al. | |
| 2010/0225226 A1 | 9/2010 | Murazaki et al. | |
| 2011/0175028 A1 | 7/2011 | Shimamura et al. | |
| 2011/0279022 A1 | 11/2011 | Winkler et al. | |
| 2011/0305005 A1 | 12/2011 | Tsukatani et al. | |
| 2012/0112130 A1 | 5/2012 | Wu et al. | |
| 2013/0001444 A1 | 1/2013 | Zhou et al. | |

FOREIGN PATENT DOCUMENTS

| | | |
|---|---|---|
| CN | 102687266 | 9/2012 |
| CN | 102723422 | 10/2012 |
| DE | 19934126 | 1/2001 |
| DE | 10 2008 051029 A1 | 4/2010 |
| EP | 1378556 | 1/2004 |
| EP | 1589090 | 10/2005 |
| JP | H0673376 A | 3/1994 |
| JP | H10242513 A | 9/1998 |
| JP | 2003505582 A | 2/2003 |
| JP | 2004-115633 A | 4/2004 |
| JP | 2005008844 A | 1/2005 |
| JP | 2006-265542 A | 10/2006 |
| JP | 2006-299168 A | 11/2006 |
| JP | 2008-189811 A | 8/2008 |
| JP | 2010-121068 A | 6/2010 |
| KR | 1002007-0106536 A | 11/2007 |
| TW | 200619356 A | 6/2006 |
| WO | WO0108452 A1 | 2/2001 |
| WO | WO2004/084261 | 9/2004 |
| WO | WO2005/061659 A1 | 7/2005 |
| WO | WO2006/129559 | 12/2006 |
| WO | WO2008/056292 A1 | 5/2008 |

OTHER PUBLICATIONS

Kim, et al., "Synthesis and Luminescent Characterization of Zinc Thiogallant", J. of Europ. Ceramic Soc., Mar. 26, 2007, Vo. 27, pp. 3667-3670.

Li, et al., "Fabrication of Transparent Cerium-doped Lutetium Aluminum Garnet Ceramics by co-Precipitation Routes", J. of the American Ceramic Soc., 2006, vol. 89, No, 7, pp. 2356-2358.

Baccaro, et al., "Influence of Si-codoping on YAG:Ce Scintillation Characteristics", IEEE Trans. on Nuclear Science, Aug. 2005, pp. 1105-1108, vol. 52, No. 4.

Fernandez, et al., "Highly Porous Yttrium Aluminum Garnet (YAG) Particles Synthesized by a Gel Supported Precipitation (GSP) Process," J. of Mat, Sci., Jan. 2003, pp. 2331-2335, vo. 38.

Wu, et al., "Spectral Properties of Various Cerium Doped garnet Phosphors for Application in White GaN-based LEDs", Mats. Research Soc. Symp. Proc., Jan. 1, 2001, vol. 658, pp. GG11.8.1-GG.11.8.6.

Kang, et al., "YAG:Ce Phosphor Particles prepared by Ultrasonic Spray Pyrolysis", Mats. Research Bull., 2000, pp. 789-798.

Li, K., et al., "Relationship between Crystal Structure and Luminescence Properties of $(Y_{0.96-x} Ln_x Ce_{0.04})_3 Al_5 O_{12}$ (Ln = Gd, La, Lu) Phosphors," Journal of Rare Earths vol. 25, 2007, pp. 692-696.

* cited by examiner

SEM Morphology of $Lu_{2.91}Ce_{0.09}Al_5O_{12}$ with different $MgF_2$ additive concentrations XRD pattern of $Y_{2.91}Ce_{0.09}Al_5O_{12}$ with different $MgF_2$ additive concentration XRD pattern of $Lu_{2.91}Ce_{0.09}Al_5O_{12}$ with different $MgF_2$ additive concentration XRD pattern of $Lu_{2.91}Ce_{0.09}Al_5O_{12}$ with 5wt% $MgF_2$ and 5wt% $SrF_2$ additive Emission Spectra of $Y_{2.91}Ce_{0.09}Al_5O_{12}$ with different $MgF_2$ additive concentration Normalized Emission Spectra of $Y_{2.91}Ce_{0.09}Al_5O_{12}$ with different $MgF_2$ additive concentration Emission Spectra of $Lu_{2.91}Ce_{0.09}Al_5O_{12}$ with different $MgF_2$ additive concentration Normalized Emission Spectra of $Lu_{2.91}Ce_{0.09}Al_5O_{12}$ with different $MgF_2$ additive concentration Normalized Emission Spectra of $Lu_{2.91}Ce_{0.09}Al_5O_{12}$
with different 5wt% $MgF_2$ and 5wt% $SrF_2$ additive Emission wavelength of $Lu_{2.91}Ce_{0.09}Al_5O_{12}$ vs $SrF_2$ additive concentration Normalized Excitation Spectra of $Lu_{2.91}Ce_{0.09}Al_5O_{12}$ with different $MgF_2$ additive concentration Temperature dependence of $Lu_{2.91}Ce_{0.09}Al_5O_{12}$ with 5%wt $MgF_2$ additive compared with commercial Ce:YAG phosphors Spectra of a white LED that contained blue InGaN LED, red phosphor $(Ca_{0.2}Sr_{0.8})AlSiN_3:Eu^{2+}$ and $Lu_{2.91}Ce_{0.09}Al_5O_{12}$ with 5%wt $SrF_2$ additive Spectra of a white LED at CIE (X=0.3, Y=0.3) that contained blue InGaN LED, red phosphor (Ca$_{0.2}$Sr$_{0.8}$)AlSiN$_3$:Eu$^{2+}$ and Lu$_{2.91}$Ce$_{0.09}$Al$_5$O$_{12}$ with 3%wt MgF$_2$ additive, Lu$_{2.91}$Ce$_{0.09}$Al$_5$O$_{12}$ with 5wt%SrF$_2$ additive and (Sr$_{0.5}$Ba$_{0.5}$)$_2$SiO$_4$:Eu$^{2+}$ phosphor

| Composition | CIEx | CIEy | Emission Peak (nm) | Relative PL Intensity | D50 (μm) |
|---|---|---|---|---|---|
| (Lu0.90Gd0.07Ce0.03)3Ba0.15Al5O12F0.30 | 0.424 | 0.543 | 554 | 114 | 12.02 |
| (Lu0.80Gd0.17Ce0.03)3Ba0.15Al5O12F0.30 | 0.453 | 0.525 | 565 | 111 | 11.15 |
| (Lu0.64Gd0.33Ce0.03)3Ba0.15Al5O12F0.30 | 0.48 | 0.505 | 576 | 101 | 9.59 |
|  |  |  |  |  |  |
| (Lu0.94Gd0.03Ce0.03)3Sr0.34Al5O12F0.68 | 0.413 | 0.55 | 551 | 132 | 15.61 |
| (Lu0.90Gd0.07Ce0.03)3Sr0.34Al5O12F0.68 | 0.429 | 0.545 | 555 | 138 | 12.94 |
| (Lu0.84Gd0.13Ce0.03)3Sr0.34Al5O12F0.68 | 0.436 | 0.537 | 558 | 122 | 14.44 |

FIG. 16

YELLOW-GREEN TO YELLOW-EMITTING PHOSPHORS BASED ON HALOGENATED-ALUMINATES

CLAIM OF PRIORITY

This application is a continuation of U.S. patent application Ser. No. 13/415,623 filed Mar. 8, 2012, entitled YELLOW-GREEN TO YELLOW-EMITTING PHOSPHORS BASED ON HALOGENATED-ALUMINATES, by Yi-Qun Li, et al., now U.S. Pat. No. 8,475,683 Issued Jul. 2, 2013, which claims the benefit of priority to U.S. Provisional Application No. 61/450,310, filed Mar. 8, 2011, entitled PHOSPHOR COMPOSITION, by Yi-Qun Lit et al., and is a continuation-in-part of U.S. patent application Ser. No. 13/181,226 filed Jul. 12, 2011, entitled GREEN-EMITTING, GARNET-BASED PHOSPHORS IN GENERAL AND BACKLIGHTING APPLICATIONS, by Yusong Wu et al., now U.S. Pat. No. 8,529,791 Issued Sep. 10, 2013, which claims the benefit of priority to U.S. Provisional Application No. 61/364,321, filed Jul. 14, 2010, entitled GREEN-EMITTING, GARNET-BASED PHOSPHORS IN GENERAL AND BACKLIGHTING APPLICATIONS, by Yusong Wu et al. and is a continuation-in-part of U.S. patent application Ser. No. 11/975,356 filed Oct. 18, 2007, now U.S. Pat. No. 8,133,461 Issued Mar. 13, 2012, entitled NANO-yAG:CE PHOSPHOR COMPOSITIONS AND THEIR METHODS OF PREPARATION, by Dejie Tao et al., which claims benefit of U.S. Provisional Application No. 60/853,382 filed Oct. 20, 2006, entitled NANO YAG:CE PHOSPHORS AND THE METHOD OF PREPARING THE SAME, by Dejie Tao et al., which applications are incorporated herein by reference in their entirety.

BACKGROUND OF THE INVENTION

1. Field of the Invention

Embodiments of the present disclosure are directed in to yellow-green to yellow-emitting phosphors based on halogenated aluminates. Such phosphors are applicable to a number of different technologic areas, including general lighting systems, white light illumination systems based on white LEDs, signal lights; indicator lights, etc., as well as display applications such as display backlighting, plasma display panels, LED-based display panels, and the like.

2. Description of the Related Art

Embodiments of the present invention are directed to halogenated aluminate-based phosphors that, when activated by cerium, and when doped with the rare earths lutetium and a second rare earth, which may be gadolinium, emit visible light in the yellow-green to yellow portion of the electromagnetic spectrum. The phrase "visible light in the yellow-green to yellow portion of the electromagnetic spectrum" is defined to mean light having a peak emission wavelength of about 550 nm to about 600 nm. Such phosphors may be used in commercial markets where white light is generated using so-called "white light LEDs," noting as an aside that this term is somewhat of a misnomer, since light emitting diodes emit light of a specific monochromatic color and not a combination of wavelengths perceived as white by the human eye. The term is nonetheless entrenched in the lexicon of the lighting industry.

Historically, YAG:Ce (yttrium aluminate garnet activated with cerium) has been used to supply the yellow component of the light in the lighting systems mentioned above. In comparison to other phosphor hosts, particularly those based on the silicates, sulphates, nitridosilicates, and oxo-nitridosilicates, YAG:Ce has a relatively high absorption efficiency when excited by blue light, is stable in high temperature and humidity environments, and has a high quantum efficiency (QE>95%), all the while displaying a broad emission spectrum.

One disadvantage to using a YAG:Ce based phosphor, other than inadequate color rendering in some situations, is that the peak emission of this phosphor is too long, that is to say, too deep towards the orange or red for use as a luminescent source in, for example, a backlighting application. An alternative to YAG:Ce is the cerium doped $Lu_3Al_5O_{12}$ compound (LAG:Ce), which has the same crystalline structure as YAG:Ce, a similar temperature and humidity stability as the yttrium-based compound, and likewise quantum efficiency. Despite these similarities, LAG:Ce exhibits a different peak emission wavelength than its YAG counterpart; in the lutetium case, this peak wavelength is at about 540 nm.

What is needed in the art, particularly in fields related to backlighting technologies and general lighting, is a phosphor with a structure comparable to a garnet in terms of temperature and humidity stability, but having at the same time a peak emission wavelength ranging from about 550 nm to about 600 mm

SUMMARY OF THE INVENTION

Embodiments of the present disclosure are directed to yellow-green and yellow-emitting aluminate based phosphors for use in white LEDs, general lighting, and LED and backlighting displays.

In one embodiment of the present invention, the cerium-activated, yellow-green to yellow-emitting aluminate phosphor comprises the rare earth lutetium, at least one alkaline earth metal, aluminum, oxygen, at least one halogen, and at least one rare earth element other than lutetium, wherein the phosphor is configured to absorb excitation radiation having a wavelength ranging from about 380 nm to about 480 nm, and to emit light having a peak emission wavelength ranging from about 550 nm to about 600 nm.

In another embodiment of the present invention, the yellow-green to yellow-emitting aluminate phosphor comprises a halogenated aluminate, an $M^{2+}X_2$ additive, and a cerium activator; where $M^{2+}$ is a divalent, alkaline earth metal selected from the group consisting of Mg, Sr, Ca, and Ba; X is a halogen selected from the group consisting of F, Cl, Br, and I; and wherein the $M^{2+}X_2$ additive is included in the phosphor in amounts ranging up to about 5 wt %, the upper endpoint inclusive.

In another embodiment of the present invention, the yellow-green to yellow-emitting phosphor comprises a halogenated aluminate having the formula $A_3B_xAl_5O_{12}C_y$:$Ce^{3+}$, where A is at least one of Lu, La, Sc, Gd, or Tb; B is at least one of Mg, Sr, Ca, or Ba; C is at least one of F, Cl, Br, or I; and y is about 2x, although y may be less than 2x by amounts (stoichiometrically) of up to 5, 10, 25, and 50 percent. The yellow-green to yellow-emitting halogenated aluminate phosphor comprises an aluminate configured to absorb excitation radiation having a wavelength ranging from about 420 nm to about 480 nm, and to emit light having a peak emission wavelength ranging from about 550 nm to about 600 nm.

In another embodiment of the present invention, the yellow-green to yellow-emitting halogenated aluminate phosphor has the formula: $(Lu_{1-x-y}A_xCe_y)_3B_zAl_5O_{12}C_{2z}$; where A is at least one of Sc, La, Gd, and Tb; B is at least one of Mg, Sr, Ca, and Ba; C is at least one of F, C, Br, and I; $0 \le x \le 0.5$; $0.001 \le y \le 0.2$; and $0.001 \le z \le 0.5$. In this embodiment, A may be Gd; B may be Ba or Sr; and C may be F.

Other embodiments of the present invention are directed to general lighting or white LEDs, which comprise a radiation source configured to provide radiation having a wavelength greater than about 280 nm; a cerium-activated, yellow-green to yellow-emitting aluminate phosphor comprising the rare earth lutetium, at least one alkaline earth metal, aluminum, oxygen, at least one halogen, and at least one rare earth element other than lutetium, wherein the phosphor is configured to absorb excitation radiation having a wavelength ranging from about 380 nm to about 480 nm, and to emit light having a peak emission wavelength ranging from about 550 nm to about 600 nm. This embodiment includes at least one of a red-emitting phosphor or a yellow-emitting phosphor. Alternative embodiments directed to general lighting or white LEDs may comprise: a radiation source configured to provide radiation having a wavelength greater than about 280 nm; a yellow-green to yellow-emitting phosphor comprising a halogenated aluminate having the formula $A_3B_xAl_5O_{12}C_y$:$Ce^{3+}$, where A is at least one of Lu, La, Sc, Gd, or Tb; B is at least one of Mg, Sr, Ca, or Ba; C is at least one of F, Cl, Br, or I; where y is about equal to or less than 2x; and at least one of a red-emitting phosphor or a yellow-emitting phosphor.

BRIEF DESCRIPTION OF THE DRAWINGS

FIG. 16 is a table giving exemplary phosphors according to the general formula $(Lu_{1-x-y}A_xCe_y)_3B_zAl_5O_{12}C_{2z}$, where A is Gd, B is either Ba or Sr, and C is F; the table also lists comparative CIE x and y coordinates of the emitted light; the peak emission wavelength in nm, relative intensities, and D50 particle size in microns.

DETAILED DESCRIPTION OF THE INVENTION

Figure 1:
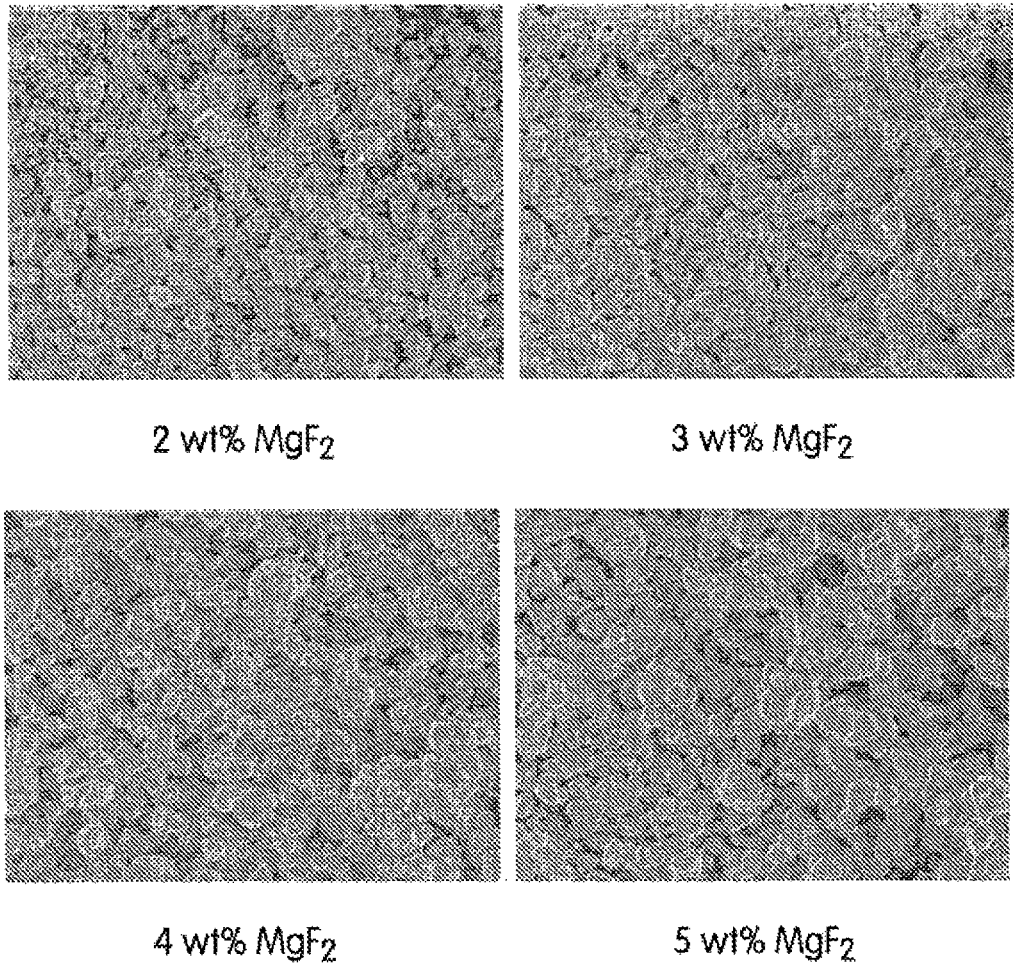
FIG. 1 shows the SEM morphology of $Lu_{2.91}Ce_{0.09}Al_5O_{12}$ with different $MgF_2$ additive concentrations, illustrating that particle sizes become larger and more homogeneous as the amount of the $MgF_2$ additive is increased.

A yttrium aluminum garnet compound activated with the rare earth cerium (YAG:Ce) has been, historically, one of the most common choices of phosphor material made if the desired application was either high power LED lighting, or cool white lighting of a non-specific, general nature. As one might expect, there is a requirement in general lighting for highly efficient components, both in the case of the LED chip supplying the blue light component of the resultant white light, and the excitation radiation for the phosphor, where the phosphor typically supplies the yellow/green constituent of the resulting product white light.

As discussed in the previous section of this disclosure, YAG:Ce demonstrates this desired high efficiency, having a quantum efficiency greater than about 95 percent, and it would therefore appear to be a difficult task to improve upon this number. But it is known in the art that the efficiency of an LED chip increases with a decrease in emission wavelength, and thus it would appear, in theory anyway, that the efficiency of a general lighting system will be enhanced if a phosphor paired with an LED chip emitting at shorter wavelengths may be excited by those shorter wavelengths. The problem with this strategy, unfortunately, is that the emission efficiency of a YAG:Ce phosphor decreases when the wavelength of its blue excitation radiation is reduced to a level below about 460 nm.

The repercussions of this are, of course, that YAG:Ce should really only be paired with an LED chip having an emission wavelength no less than about 450 to 460 nm. But it is also known in the art that photon energies of the phosphor's excitation radiation depend strongly on the structure of the anionic polyhedron (comprising oxygen atoms in this case) surrounding the activator cation (cerium). It follows that the efficiency of the system may be enhanced if the excitation range of a garnet-based phosphor might be extended towards shorter wavelengths relative to a YAG:Ce phosphor. Thus, one of the objects of the present invention include altering the structure and nature of this anionic polyhedron to shift the excitation range the phosphor "desires" to see to shorter wavelengths relative to that of the traditional YAG:Ce, while maintaining in the meantime (or even improving) the enhanced properties that many garnets display.

The present disclosure will be divided into the following sections: first, a chemical description (using stoichiometric formulas) of the present halogenated aluminates will be given, followed by a brief description of viable synthetic methods that may be used to produce them. The structure of the present halogenated aluminates will be discussed next, along with its relationship to experimental data comprising wavelength and photoluminescent changes upon the inclusion of certain halogen dopants. Finally, the role these yellow-green and yellow-emitting phosphors may play in white light illumination, general lighting, and backlighting applications will be presented with exemplary data.

Chemical Description of the Present Halogenated Aluminate-Based Phosphors

The yellow to green-emitting, aluminate-based phosphors of the present invention contain both alkaline earth and halogen constituents. These dopants are used to achieve the desired photoemission intensity and spectral properties, but the fact that simultaneous alkaline earth and halogen substitutions provide a sort of self-contained charge balance is fortuitous as well. Additionally, there may be other advantageous compensations having to do with the overall changes to the size of the unit cell: while substitutions of any of Sc, La, Gd, and/or Tb for Lu (either individually, or in combinations) may tend to expand or contract the size of the cell, the opposite effect may occur with substitutions of halogen for oxygen.

There are several ways to describe the formula of the present phosphors. In one embodiment, a green emitting, cerium-doped, aluminate-based phosphor may be described by the formula $(Lu_{1-a-b-c}Y_aTb_bA_c)_3(Al_{1-d}B_d)_5(O_{1-e}C_e)_{12}$:Ce, Eu, where A is selected from the group consisting of Mg, Sr, Ca, and Ba; B is selected from the group consisting of Ga and In; C is selected from the group consisting of F, Cl, and Br; $0 \le a \le 1$; $0 \le b \le 1$; $0 < c \le 0.5$; $0 \le d \le 1$; and $0 < e \le 0.2$. The "A" element, which may be any of the alkaline earth elements Mg, Sr, Ca, and Ba, used either solely or in combination, is very effective in shifting emission wavelength to shorter values. These compounds will be referred to in the present disclosure as "halogenated LAG-based" aluminates, or simply "halogenated aluminates."

In an alternative embodiment, the present yellow to green-emitting, aluminate-based phosphors may be described by the formula $(Y,A)_3(Al,B)_5(O,C)_{12}$:Ce$^{3+}$, where A is at least one of Tb, Gd, Sm, La, Lu, Sr, Ca, and Mg, including combinations of those elements, wherein the amount of substitution of those elements for Y ranges from about 0.1 to about 100 percent in a stoichiometric manner. B is at least one of Si, Ge, B, P, and Ga, including combinations, and these elements substitute for Al in amounts ranging from about 0.1 to about 100 percent stoichiometrically. C is at least one of F, Cl, N, and S, including combinations, substituting for oxygen in amounts ranging from about 0.1 to about 100 percent stoichiometrically.

In an alternative embodiment, the present yellow to green-emitting, aluminate-based phosphors may be described by the formula $(Y_{1-x}Ba_x)_3Al_5(O_{1-y}C_y)_{12}$:Ce$^{3+}$, where x and y each range from about 0.001 to about 0.2.

In an alternative embodiment, a yellow-green to green-emitting, aluminate-based phosphor may be described by the formula $(A_{1-x}^{3+}B_x^{2+})_mAl_5(O_{1-y}^{2-}C_y^{1-})_n$:Ce$^{3+}$, where A is selected from the group consisting of Y, Sc, Gd, Tb, and Lu; B is selected from the group consisting of Mg, Sr, Ca, and Ba; C is selected from the group consisting of F, Cl, and Br; $0 \le x \le 0.5$; $0 < y \le 0.5$; $2 \le m \le 4$; and $10 \le n \le 14$.

In an alternative embodiment, a yellow-green to green-emitting, aluminate-based phosphor may be described by the formula $(A_{1-x}^{3+}B_x^{2+})_mAl_5(O_{1-y}^{2-}C_y^{1-})n$:Ce$^{3+}$, where A is selected from the group consisting of Y, Sc, Gd, Tb, and Lu; B is selected from the group consisting of Mg, Sr, Ca, and Ba; C is selected from the group consisting of F, Cl, and Br; $0 \le x \le 0.5$; $0 \le y \le 0.5$; $2 \le m \le 4$; and $10 \le n \le 14$; subject to the proviso that m is not equal to 3.

In an alternative embodiment, a yellow-green to green-emitting, aluminate-based phosphor may be described by the formula $(A_{1-x}^{3+}B_x^{2+})_mAl_5(O_{1-y}^{2-}C_y^{1-})_n$:Ce$^{3+}$, where A is selected from the group consisting of Y, Sc, Gd, Tb, and Lu; B is selected from the group consisting of Mg, Sr, Ca, and Ba; C is selected from the group consisting of F, Cl, and Br; $0 \le x \le 0.5$; $0 \le y \le 0.5$; $2 \le m \le 4$; and $10 \le n \le 14$; subject to the proviso that n is not equal to 12.

In an alternative embodiment, a yellow to green-emitting, aluminate-based phosphor may be described by the formula $(Lu_{1-x-y}A_xCe_y)_3B_zAl_5O_{12}C_{2z}$, where A is at least one of Sc, La, Gd, and Tb; B is at least one of the alkaline earths Mg, Sr, Ca, and Ba; C is at least one of the halogen elements F, C, Br, and I; and the values of the parameters x, y, z are $0 \le x \le 0.5$; $0.001 \le y \le 0.2$; and $0.001 \le z \le 0.5$. It is noted that "at least one of" with regard to the formulas in this disclosure means that the elements in that group may appear in the phosphor either individually, or in combinations, where any combinations of any of the elements in that group are allowable, provided that the total amount of that group satisfies the rule assigned to it in terms of overall stoichiometric amounts.

One of ordinary skill in the art will appreciate that the relationship between the amounts of C, the halogen, and B, the alkaline earth, may not always be present in the phosphor product at the expected ratio of 2:1 (stoichiometrically speaking) after a processing step such as sintering if the C and B components are added to the starting mix of materials in the form of an alkaline earth salt (e.g., B$^{2+}$C$_2$). This is because the halogen component is known to be volatile, and in some instances, some of the C is lost relative to B such that the ratio of B to C in the final phosphor product is less than 2:1. Thus, in an alternative embodiment of the present invention, the amount of C is less than 2z in the formula of paragraph [0045] by an amount of up to 5 percent by number. In various other embodiments, the amount of C is less than 2z by an amount of up to 10, 25, and 50 percent stoichiometrically.

Synthesis

Any number of methods may be used to synthesize the present yellow-green to yellow-emitting, aluminate-based phosphors, methods that may involve both solid state reaction mechanisms as well as liquid mixing techniques. Liquid mixing includes such methods as co-precipitation and sol-gel techniques.

One embodiment of preparation involves a solid state reaction mechanism comprising the steps:
  (a) desired amounts of the starting materials $CeO_2$, $Y_2O_3$, lutetium salts including the nitrates, carbonates, halides, and/or oxides of lutetium, salts of the other rare earths Sc, La, Gd, and Tb, and $M^{2+}X_2$, where M is a divalent alkaline earth metal selected from the group consisting of Mg, Sr, Ca, and Ba, and X is a halogen selected from the group consisting of F, Cl, Br, and I were combined to form a mixture of starting powders;
  (b) the mix of starting powders from step (a) is dry-mixed using any conventional method, such as ball milling, and typical mixing times using ball milling are greater than about 2 hours (in one embodiment about 8 hours);
  (c) sintering the mixed starting powders from step (b) at a temperature of about 1400° C. to about 1600° C. for about 6 to about 12 hours in a reducing atmosphere (the purpose of this atmosphere is for a reduction of the ammonia-based compounds);
  (d) crushing the sintered product from step (c), and washing it with water; and
  (e) drying the washed product from step (d), wherein the drying conditions may be constitute a time of about 12 hours at a temperature of about 150° C.

The present aluminates may be synthesized by liquid mixing techniques. An example of the synthesis of a non-halogenated LAG compound having the formula $Lu_{2.985}Ce_{0.015}Al_5O_{12}$ using co-precipitation has been described by H.-L. Li et al. in an article titled "Fabrication of Transparent Cerium-Doped Lutetium Aluminum Garnet Ceramics by Co-Precipitation Routes," *J. Am. Ceram. Soc.* 89 [7] 2356-2358 (2006). These non-halogenated LAG compounds contained no alkaline earth constituents. The article is incorporated herein in its entirety, as it is contemplated that a similar co-precipitation method may be used to produce the halogenated LAGs of the present disclosure with alkaline earth constituents.

An example of the synthesis of a halogenated YAG compound using a sol-gel technique has been described in U.S. Pat. No. 6,013,199 by E. McFarland et al., to Symyx Technologies, titled "Phosphor materials." These (possibly) halogenated YAG compounds contained no alkaline earth constituents. This patent is incorporated herein in its entirety, as it is contemplated that a similar sol-gel method may be used to produce the halogenated YAG compounds of the present disclosure with alkaline earth constituents.

FIG. 1 shows the SEM morphology of an exemplary $Lu_{2.91}Ce_{0.09}Al_5O_{12}$ phosphors with different $MgF_2$ additive concentrations, synthesized via the solid state mechanisms described above. The morphology as revealed by scanning electron microscope (SEM) shows that particle sizes become larger, and more homogeneous, as the amount of the $MgF_2$ additive is increased.

Crystal Structure of the Present Yellow-Green to Yellow Emitting Aluminates

The crystal structure of the present yellow-green to yellow aluminates is similar to that of the yttrium aluminum garnet, $Y_3Al_5O_{12}$, and in keeping with this well studied YAG compound, the present aluminates may belong to the space group Ia3d (no. 230). This space group, as it pertains to YAG, has been discussed by Y. Kuru et al. in an article titled "Yttrium Aluminum Garnet as a Scavenger for Ca and Si," *J. Am. Ceram. Soc.* 91 [11] 3663-3667 (2008). As described by Y. Kuru et al., YAG has a complex crystal consisting of 160 atoms (8 formula units) per unit cell, where the $Y^{3+}$ occupy positions of multiplicity 24, Wyckoff letter "c," and site symmetry 2.22, and the $O^{2-}$ atoms occupy positions of multiplicity 96, Wyckoff letter "h," and site symmetry 1. Two of the $Al^{3+}$ ions are situated on octahedral 16(a) positions, whereas the remaining three $Al^{3+}$ ions are positioned on tetrahedral 24(d) sites.

The lattice parameters of the YAG unit cell are $a=b=c=1.2008$ nm, and $\alpha=\beta=\gamma=90°$. Whereas substitution of lutetium for yttrium is expected to expand the size of the unit cell, the angles between the unit cell axes are not expected to change, and the material will retain its cubic character.

Figure 2:
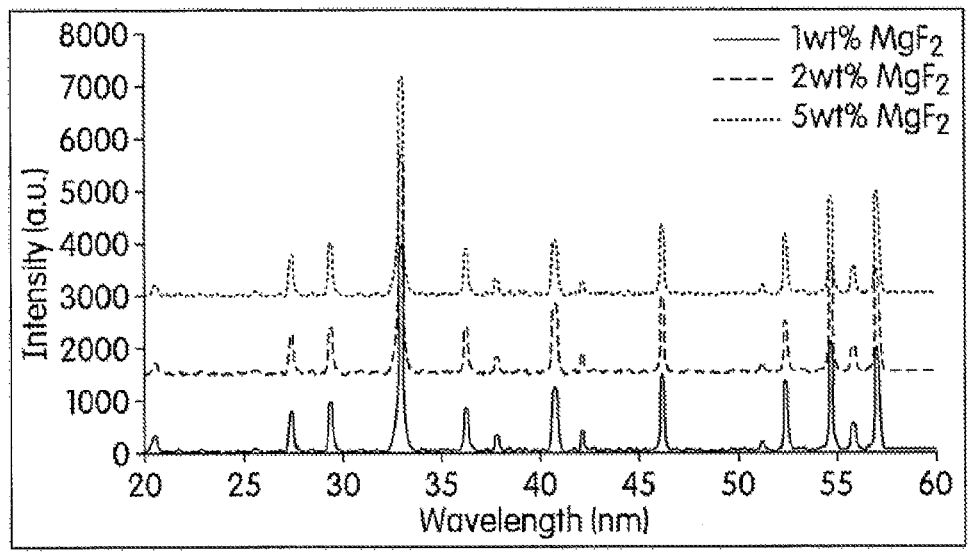
FIG. 2 is a series of x-ray diffraction (XRD) patterns of exemplary $Y_{2.91}Ce_{0.09}Al_5O_{12}$ phosphors with different $MgF_2$ additive concentrations.

FIG. 2 shows the x-ray diffraction (XRD) patterns of a series of exemplary $Y_{2.91}Ce_{0.09}Al_5O_{12}$ phosphors with different $MgF_2$ additive concentrations, showing how the addition of an alkaline earth and a halogen ($MgF_2$) component shifts high angle diffraction peaks to higher values of $2\theta$. This means that the lattice constants become smaller relative to a YAG component with no alkaline earth/halogen, and further indicates that $Mg^{2+}$ is being incorporated into the crystal lattice, occupying $Y^{3+}$ positions.

Figure 3:
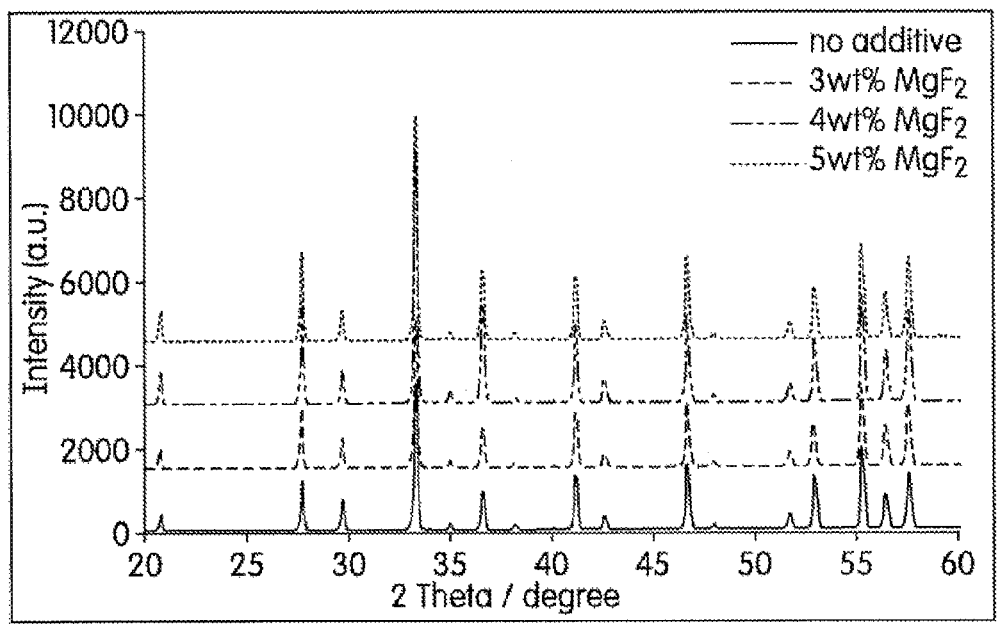
FIG. 3 is a series x-ray diffraction (XRD) patterns of exemplary $Lu_{2.91}Ce_{0.09}Al_5O_{12}$ phosphors with different $MgF_2$ additive concentrations.

FIG. 3 shows the x-ray diffraction (XRD) pattern of a series of exemplary phosphors in an analogous manner to FIG. 2, except that this time the series of compounds are $Lu_{2.91}Ce_{0.09}Al_5O_{12}$ phosphors with different $MgF_2$ additive concentrations, where lutetium-based compounds are being studied, rather than yttrium-based compounds.

Figure 4:
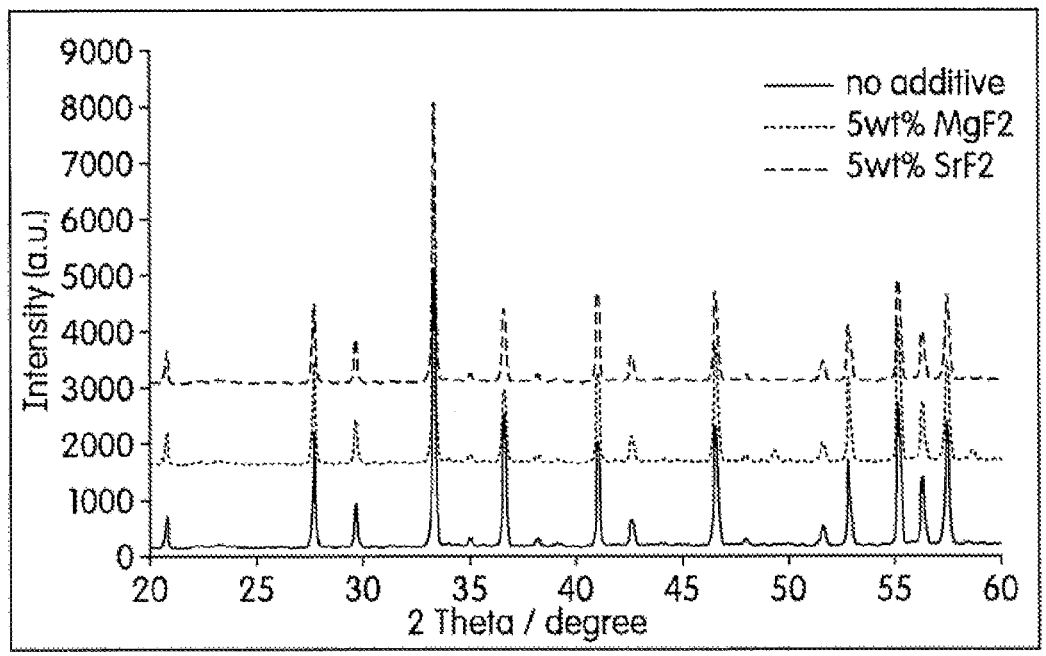
FIG. 4 is a series of the x-ray diffraction (XRD) patterns of exemplary $Lu_{2.91}Ce_{0.09}Al_5O_{12}$ phosphors having a 5 wt % $MgF_2$ additive and a 5 wt % $SrF_2$ additive.

FIG. 4 shows the x-ray diffraction (XRD) pattern of a series of exemplary $Lu_{2.91}Ce_{0.09}Al_5O_{12}$ phosphors having either a 5 wt % $MgF_2$ and 5 wt % $SrF_2$ additive: this experiment shows a comparison of the Mg constituent versus an Sr constituent. The data shows that with the $MgF_2$ additive in the $Lu_{2.91}Ce_{0.09}Al_5O_{12}$ lattice, high angle diffraction peak move to greater values of $2\theta$, meaning that lattice constants become smaller. Alternatively, with $SrF_2$ additive, high angle diffraction peaks move to smaller values of $2\theta$, meaning that the lattice constants increase. It will be apparent to those skilled in the art that both $Mg^{2+}$ and $Sr^{2+}$ are being incorporated into the $Lu_{2.91}Ce_{0.09}Al_5O_{12}$ lattice and occupying $Lu^{3+}$ positions. These peak shifts in position occur because $Mg^{2+}$, with its ionic radius of 0.72 Å, is smaller than $Lu^{3+}$ (0.86 Å), while $Sr^{2+}$ (1.18 Å) is bigger than $Lu^{3+}$.

Mechanism of Alkaline Earth and Halogen Influence on Optical Properties

In one embodiment of the present invention, $Ce^{3+}$ is the luminescent activator in the aluminate-based phosphor. The transition between the 4f and 5d energy levels of the $Ce^{3+}$ ion corresponds to excitation of the phosphor with blue light; green light emission from the phosphor is a result from the same electronic transition. In the aluminate structure, the $Ce^{3+}$ is located at the center of an octahedral site formed by a polyanionic structure of six oxygen ions. It will be appreciated by those skilled in the art that according to crystal field theory, the surrounding anions (which may also be described as ligands) induce an electrostatic potential on the 5d electron of the central cation. The 5d energy level splitting is 10Dq, where Dq is known to depend on the particular ligand species. From the spectrochemical series it may be seen that the Dq of a halide is smaller than that of oxygen, and thus it follows that when oxygen ions are replaced by halide ions, the Dq will decrease correspondingly.

The implications of this are that the band gap energy; that is to say, the energy difference between the 4f and 5d electronic levels, will increase with substitution of oxygen ions with halide in the polyanionic cages surrounding activator ions. This is why the emission peak shifts to shorter wavelength with halogen substitution. Simultaneously, with the introduction of halide ions in the oxygen polyanionic structures forming octahedral sites, a corresponding cation may also replace a portion of the Lu (and/or Sc, La, Gd, and Tb)

content. If the cation replacing Lu (and/or the other rare earths) is a smaller cation, the result will be a shift of the emission peak towards the blue end of the spectrum. The emitted luminescence will have a shorter wavelength than otherwise would have occurred. In contrast, if the cation replacing Lu is a larger cation, such as Sr or Ba, the result will be a shift of the emission peak towards the red end of the spectrum. In this case, the emitted luminescence will have a longer wavelength.

Combined with the effects of the halide, Mg as an alkaline earth substituent will be a better choice than Sr if a blue-shift is desired, and this will be shown experimentally in the following portions of the present disclosure. It is also known the LAG emission peak is a doublet due to spin-orbit coupling. As the blue-shift occurs, the emission with shorter wavelength is biased and its intensity increases correspondingly. This trend is not only helpful to the blue-shift of the emission, but also enhances photoluminescence.

Figure 5:
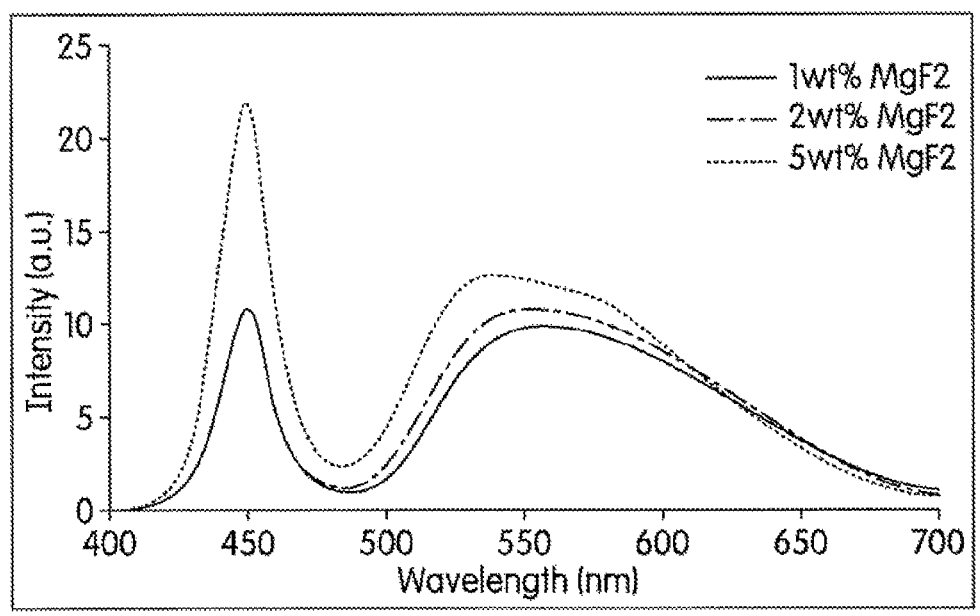
FIG. 5 is the emission spectra of a series of exemplary $Y_{2.91}Ce_{0.09}Al_5O_{12}$ phosphors with different levels of $MgF_2$ additive, the emission spectra obtained by exciting the phosphors with a blue LED.

FIG. 5 is the emission spectra of a series of exemplary $Y_{2.91}Ce_{0.09}Al_5O_{12}$ phosphors with different levels of $MgF_2$ additive, the emission spectra obtained by exciting the phosphors with a blue LED. This data shows that with increasing amounts of $MgF_2$ the photoluminescent intensity increases and the peak emission wavelength shifts to shorter values. Though not shown on FIG. 5, the present inventors have data for a 5 wt % addition of $BaF_2$ to the starting powders: this phosphor showed a significant increase in photoluminescent intensity relative to the three magnesium-containing phosphors, and a peak emission wavelength that is about the same as that of the 1 wt % sample.

Figure 6:
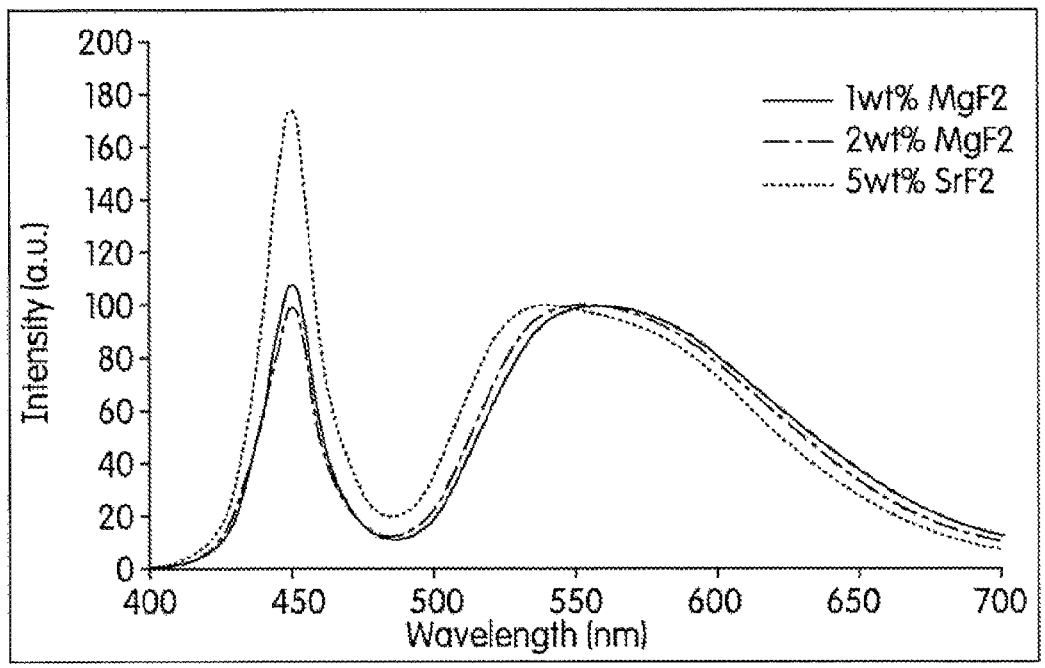
FIG. 6 is the normalized emission spectra of a series of exemplary $Lu_{2.91}Ce_{0.09}Al_5O_{12}$ phosphors with different $MgF_2$ additive concentrations under blue LED excitation.

A normalized version of the data from FIG. 5 is shown in FIG. 6. FIG. 6 is the normalized emission spectra of the same series of exemplary $Lu_{2.91}Ce_{0.09}Al_5O_{12}$ phosphors with different $MgF_2$ additive concentrations under blue LED excitation, but where normalizing the photoluminescent intensity to a single value highlight that the emission peak of $Y_{2.91}Ce_{0.09}Al_5O_{12}$ shifts to short wavelength with increasing amounts of the $MgF_2$ additive. The greater the amount of the $MgF_2$ additive, the shorter emission peak wavelength. This is the same trend with demonstrated by a $Lu_{2.91}Ce_{0.09}Al_5O_{12}$ phosphor, as will be demonstrated next.

Figure 7:
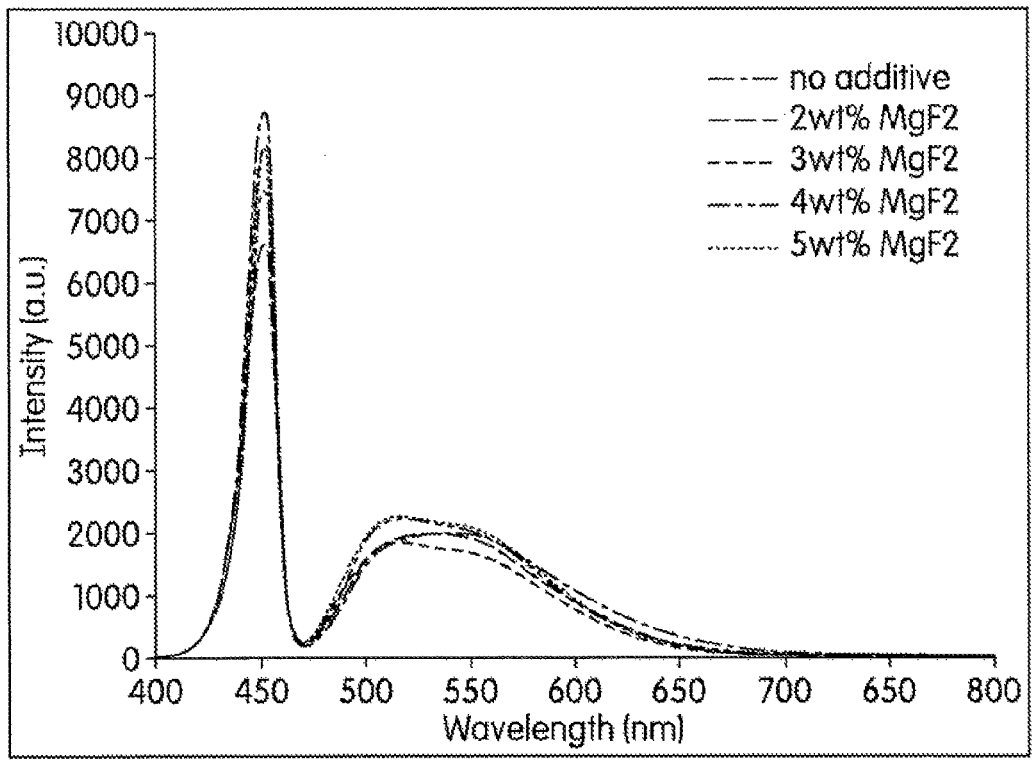
FIG. 7 is the emission spectra of $Lu_{2.91}Ce_{0.09}Al_5O_{12}$ phosphors with different $MgF_2$ additive under blue LED excitation.

FIG. 7 is the emission spectra of a series of exemplary $Lu_{2.91}Ce_{0.09}Al_5O_{12}$ phosphors with different levels of $MgF_2$ additive, the emission spectra obtained by exciting the phosphor with a blue LED. This data is analogous to that of FIG. 5, except that lutetium-based rather than yttrium-based compounds are being studied. As with the yttrium data, this data for lutetium shows similar trends for the shift in emission wavelength, though those trends for photoluminescent intensity are not, perhaps, as similar.

Figure 8:
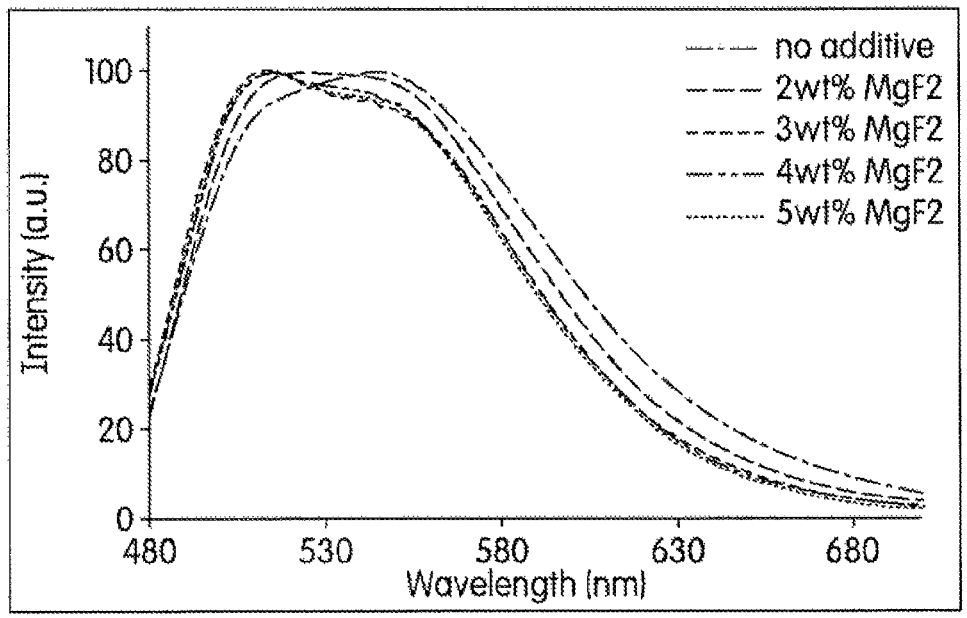
FIG. 8 is the normalized emission spectra of $Lu_{2.91}Ce_{0.09}Al_5O_{12}$ phosphors with different $MgF_2$ additive under blue LED excitation; the results show that the emission peak of $Lu_{2.91}Ce_{0.09}Al_5O_{12}$ shifts to short wavelength with certain amount of $MgF_2$ additive, and that the greater the amount of the $MgF_2$ additive, the shorter emission peak wavelength.

The $Lu_{2.91}Ce_{0.09}Al_5O_{12}$ emission spectra of FIG. 7 have been normalized to emphasize the effect of the addition of halogen salt on peak emission wavelength; the normalized version of the data is shown in FIG. 8. As in the yttrium case, peak emission shifts to shorter wavelength with increasing amounts of $MgF_2$ additive; that is to say, the greater the amount of the $MgF_2$ additive, the shorter the emission peak wavelength. The amount of wavelength shift upon increasing the amount of the $MgF_2$ additive from zero (no additive) to about 5 wt % of the additive was observed to be about 40 nm; from about 550 nm to about 510 nm.

Each of the graphs in FIGS. 5-8 have plotted their respective spectra as a series of phosphor compositions with increasing additive concentration, starting at no additive, and ending with the highest concentration of the series at 5 wt %. To emphasize a comparison of the $SrF_2$ additive with the $MgF_2$ additive, in other words, a phosphor with a Sr alkaline earth and fluorine content with a phosphor having a Mg alkaline earth and fluorine content, the phosphors have been plotted together in FIG. 9: a phosphor with no additive, a phosphor with 5 wt % $SrF_2$, and a phosphor with 5 wt % $MgF_2$. The phosphor is based on the sample $Lu_{2.91}Ce_{0.09}Al_5O_{12}$.

Figure 9:
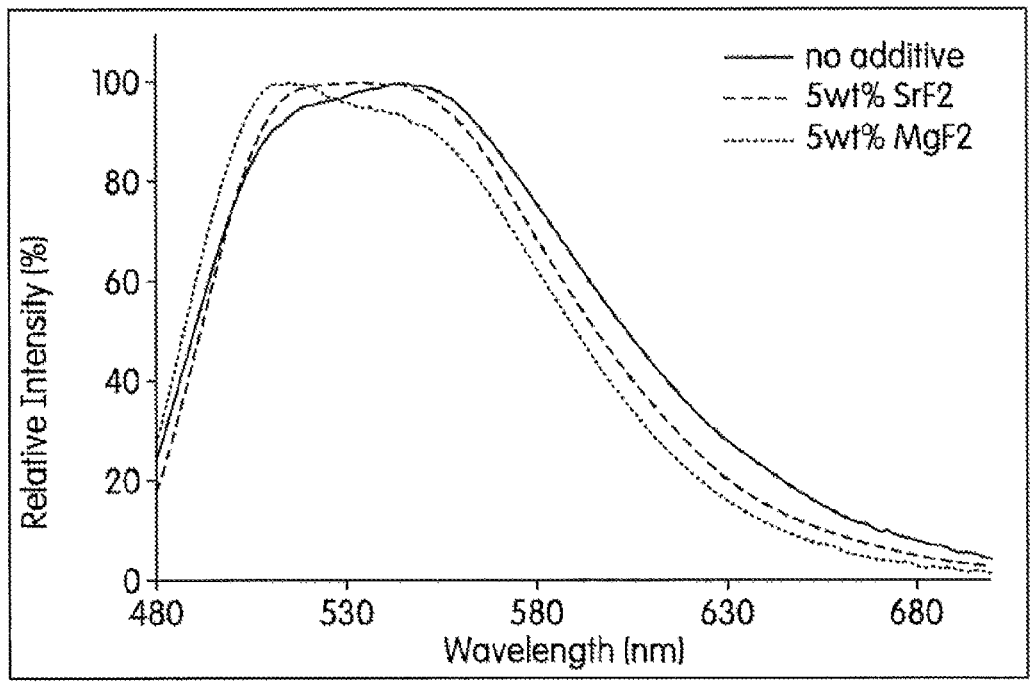
FIG. 9 is a normalized emission spectra of a $Lu_{2.91}Ce_{0.09}Al_5O_{12}$ phosphor with 5 wt % $MgF_2$ and 5 wt % $SrF_2$ additives where the phosphor has been excited with a blue LED; the results are compared with a control sample that contains no halogenated salts as an additive; the results illustrate that the emission peak shifts to shorter wavelengths with the $MgF_2$ synthesized compound than it does for the $SrF_2$ synthesized compound.

The emission spectra data in FIG. 9 has been normalized to better emphasize the effects on optical properties rendered by the inclusion of the halogen and alkaline earths. When excited with a blue LED, the result illustrates that the emission peak shifts to shorter wavelengths with the addition of $MgF_2$ and $SrF_2$. The $Lu_{2.91}Ce_{0.09}Al_5O_{12}$ sample with no additive shows a peak emission wavelength at about 550 nm; with a 5 wt % $SrF_2$ additive the peak emission wavelength shifts to about 535 nm, and with a 5 wt % $MgF_2$ additive the wavelength shifts even further to about 510 nm.

Figure 10:
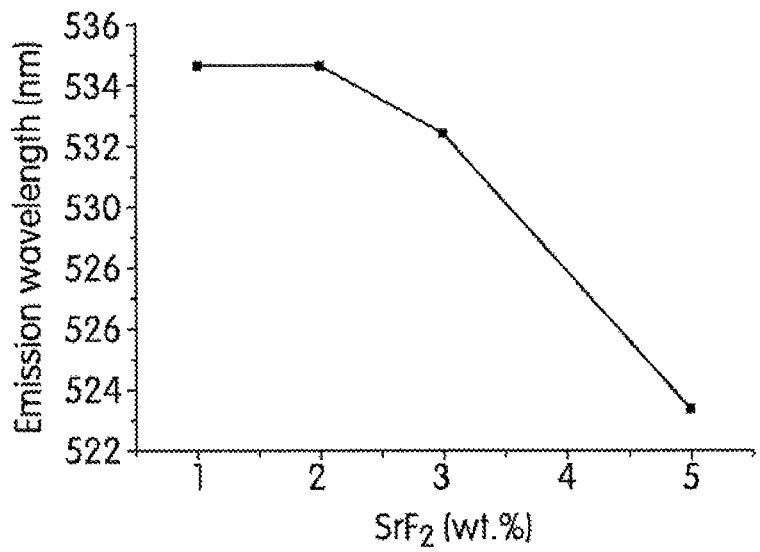
FIG. 10 shows how the emission wavelength of a series of exemplary $Lu_{2.91}Ce_{0.09}Al_5O_{12}$ phosphors decreases as the concentration of an $SrF_2$ additive is increased.

FIG. 10 shows how the emission wavelength of a series of exemplary $Lu_{2.91}Ce_{0.09}Al_5O_{12}$ phosphors decreases as the concentration of a $SrF_2$ additive is increased. Peak emission wavelength has been plotted as a function of the amount of the $SrF_2$ additive; samples having a $SrF_2$ additive content of 1, 2, 3, and 5 wt % were tested. The results show that the peak emission wavelength was about the same for the 1 and 2 wt % samples, the wavelength being about 535 nm; as the $SrF_2$ additive is increased to 3 wt % the peak emission wavelength decreases to about 533 nm. With a further increase of $SrF_2$ additive to 5 wt % peak wavelength drops precipitously to about 524 nm.

Excitation Spectra and Temperature Dependence

Figure 11:
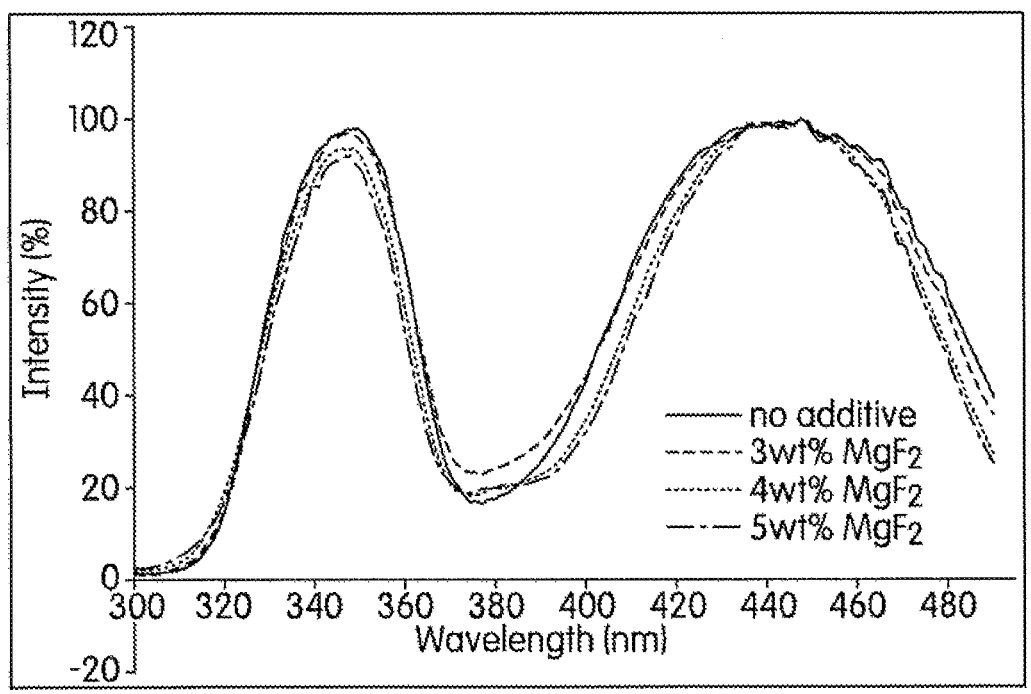
FIG. 11 is the normalized excitation spectra of a series of exemplary $Lu_{2.91}Ce_{0.09}Al_5O_{12}$ phosphors with different $MgF_2$ additive concentrations, showing that the excitation spectra becomes more narrow when the $MgF_2$ additive concentration is increased.

FIG. 11 is the normalized excitation spectra of a series of exemplary $Lu_{2.91}Ce_{0.09}Al_5O_{12}$ phosphors with different $MgF_2$ additive concentrations, showing that the excitation spectra becomes more narrow when the $MgF_2$ additive concentration is increased. The data shows that the present green emitting, aluminate-based phosphors exhibit a wide band of wavelengths over which the phosphors may be excited, ranging from about 380 to about 480 nm.

Figure 12:
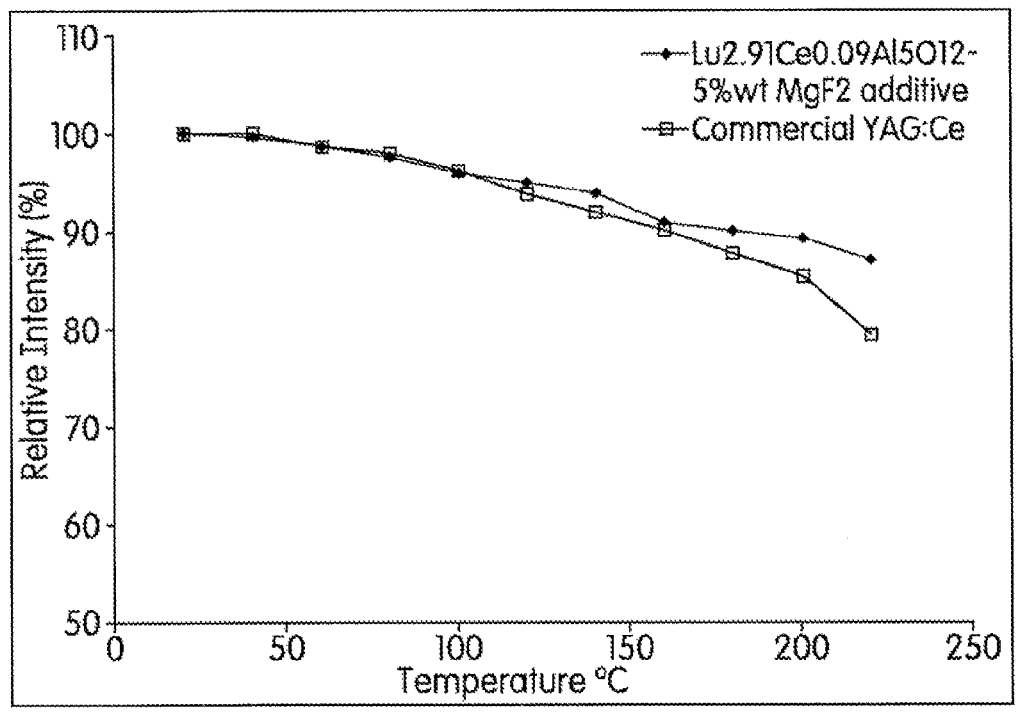
FIG. 12 shows the temperature dependence of an exemplary $Lu_{2.91}Ce_{0.09}Al_5O_{12}$ phosphor with a 5 wt % $MgF_2$ additive.

The thermal stability of the present garnet phosphors is exemplified by the lutetium containing compound $Lu_{2.91}Ce_{0.09}Al_5O_{12}$ with a 5 wt % $MgF_2$ additive; its thermal stability is compared with the commercially available phosphor $Ce^{3+}:Y_3Al_5O_{12}$ in FIG. 12. It may be observed that the thermal stability of the $Lu_{2.91}Ce_{0.09}Al_5O_{12}$ compound is even better than the YAG.

Applications to Backlighting and White Light Illumination Systems

According to further embodiments of the present invention, the present green emitting, aluminate-based phosphors may be used in white light illumination systems, commonly known as "white LEDs," and in backlighting configurations for display applications. Such white light illumination systems comprise a radiation source configured to emit radiation having a wavelength greater than about 280 nm; and a halide anion-doped green aluminate phosphor configured to absorb at least a portion of the radiation from the radiation source, and emit light having a peak wavelength ranging from 480 nm to about 650 nm.

Figure 13:
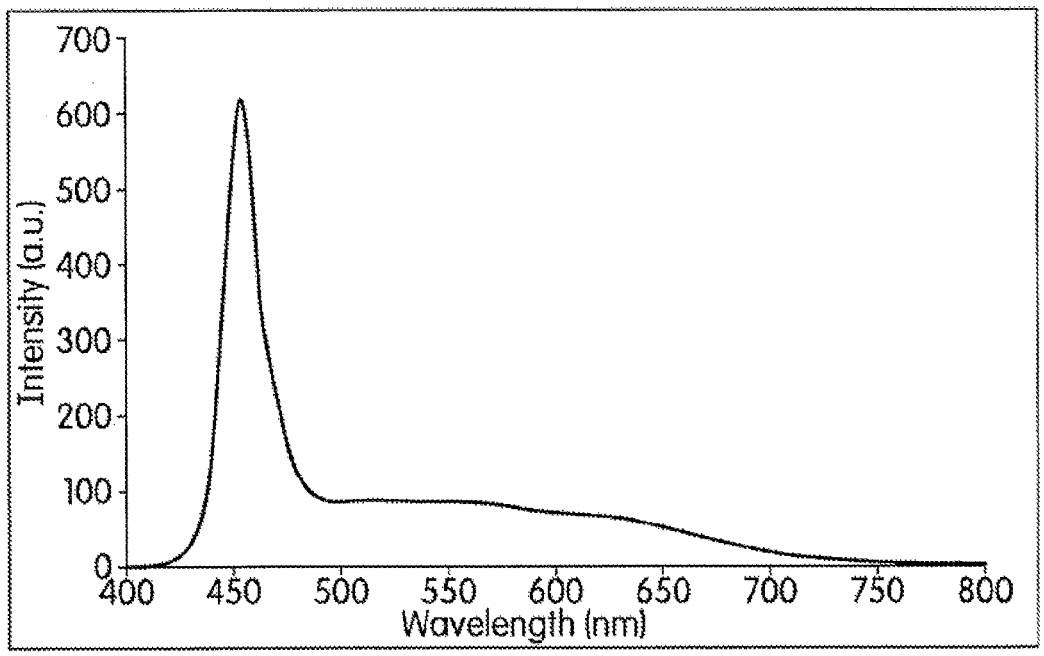
FIG. 13 shows the spectra of a white LED that includes an exemplary green-emitting, aluminate-based phosphor having the formula $Lu_{2.91}Ce_{0.09}Al_5O_{12}$ with 5 wt % $SrF_2$ additive; the white LED also includes a red phosphor having the formula $(Ca_{0.2}Sr_{0.8})AlSiN_3$:$Eu^{2+}$, and when both green and red phosphors are excited with an InGaN LED emitting blue light, the resulting white light had the color properties CIE x=0.24, and CIE y=0.20.

FIG. 13 shows the spectra of a white LED that includes an exemplary green-emitting, aluminate-based phosphor having the formula $Lu_{2.91}Ce_{0.09}Al_5O_{12}$ with a 5 wt % $SrF_2$ additive. This white LED further includes a red phosphor having the formula $(Ca_{0.2}Sr_{0.8})AlSiN_3:Eu^{2+}$. When both green aluminate and red nitride phosphors are excited with an InGaN LED emitting blue light, the resulting white light displayed the color coordinates CIE x=0.24, and CIE y=0.20.

Figure 14:
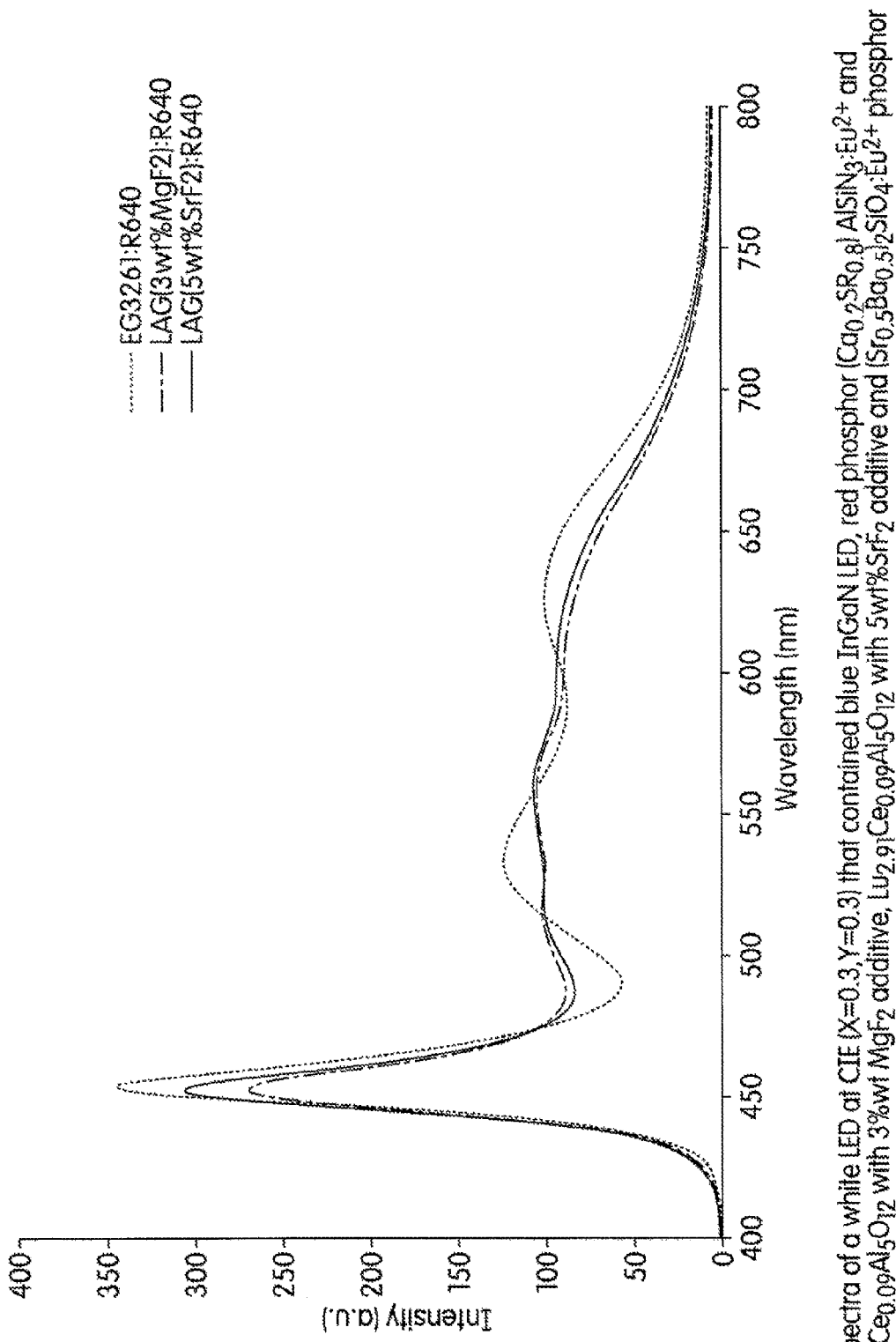
FIG. 14 is the spectra of a white LED with the following components: a blue InGaN LED, a green garnet having the formula $Lu_{2.91}Ce_{0.09}Al_5O_{12}$ with either 3 or 5 wt % additives, a red nitride having the formula $(Ca_{0.2}Sr_{0.8})AlSiN_3$:$Eu^{2+}$ or a silicate having the formula $(Sr_{0.5}Ba_{0.5})_2SiO_4$:$Eu^{2+}$, wherein the white light has the color coordinates CIE (x=0.3,y=0.3).

FIG. 14 is the spectra of a white LED with the following components: a blue InGaN LED, a green garnet having the formula $Lu_{2.91}Ce_{0.09}Al_5O_{12}$ with either 3 or 5 wt % additives, a red nitride having the formula $(Ca_{0.2}Sr_{0.8})AlSiN_3:Eu^{2+}$ or a silicate having the formula $(Sr_{0.5}Ba_{0.5})2SiO_4:Eu^{2+}$, wherein the white light has the color coordinates CIE (x=0.3, y=0.3). The sample that shows the most prominent double peak is the one labeled "EG3261+R640," where the EG3261 designation represents the $(Sr_{0.5}Ba_{0.5})_2SiO_4:Eu^{2+}$ phosphor, in combination with the red R640 $(Ca_{0.2}Sr_{0.8})AlSiN_3:Eu^{2+}$ phosphor emitting at about 640 nm. The two peaks labeled LAG (3 wt % $MgF_2$)+R640 and LAG (5 wt % $SrF_2$)+R640 demonstrate a much more uniform emission of perceived white light over the wavelength range 500 to 650 nm, an attribute desirable in the art.

Figure 15:
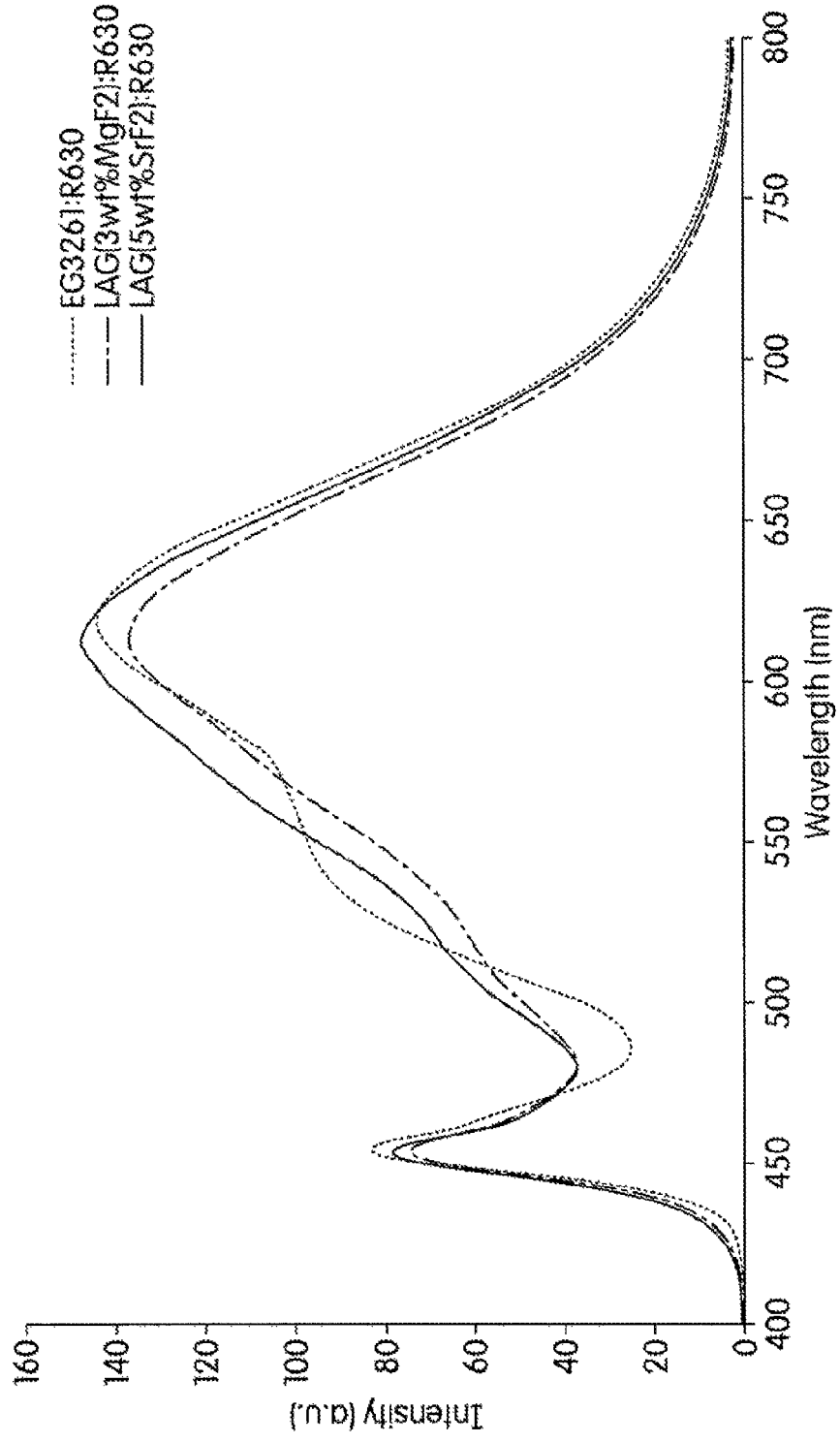
FIG. 15 is the spectra of the white LED systems of FIG. 14, in this instance measured at 3,000 K.

FIG. 15 is the spectra of the white LED systems of FIG. 14, in this instance measured at 3,000 K.

In embodiments of the present invention, the red nitride that may be used in conjunction with the green aluminate may have the general formula $(Ca,Sr)AlSiN_3:Eu^{2+}$, where the red nitride may further comprise an optional halogen, and wherein the oxygen impurity content of the red nitride phosphor may be less than or equal to about 2 percent by weight. The yellow-green silicates may have the general formula $(Mg,Sr,Ca,Ba)_2SiO_4:Eu^{2+}$, where the alkaline earths may appear in the compound either individually, or in any combination, and wherein the phosphor may be halogenated by F, Cl, Br, or I (again, either individually, or in any combination).

Optical and Physical Data in Table Form

A summary of exemplary data is tabulated in the two tables at the end of this specification. In Table 1 is the testing results of a $Lu_{2.91}Ce_{0.09}Al_5O_{12}$ based phosphor with three different $MgF_2$ additive levels. Table 2 tabulates the testing results of a $Lu_{2.91}Ce_{0.09}Al_5O_{12}$ based compound with four different $SrF_2$ additive. These results summarize and confirm that $MgF_2$ and $SrF_2$ additives in $Lu_{2.91}Ce_{0.09}Al_5O_{12}$ shift the emission peak wavelength to shorter wavelengths, where the emission intensity is increased with increasing $MgF_2$ and $SrF_2$ concentration. The particle size also increases with the increasing $MgF_2$ and $SrF_2$ additive concentration.

Yellow-Green to Yellow Emitting Rare Earth Doped Aluminate-Based Phosphors

The rare earth doping of a specific series of yellow-green to yellow emitting, halogenated aluminates were tested by the present inventors, where the phosphors had the general formula $(Lu_{1-x-y}A_xCe_y)_3B_zAl_5O_{12}C_{2z}$. As disclosed above, A is at least one of Sc, La, Gd, and Tb; B is at least one of the alkaline earths Mg, Sr, Ca, and Ba; C is at least one of the halogen elements F, Cl, Br, and I; and the values of the parameters x, y, z are $0 \le x \le 0.5$; $0.001 \le y \le 0.2$; and $0.001 \le z \le 0.5$. In this series of phosphors, the rare earth dopant was Gd, and the alkaline earth was either Ba or Sr. The halogen was F in all of the compounds tested in this series of experiments. The formulas of the specific aluminates tested are shown in FIG. 16.

For the purpose of this disclosure, a green emission will be defined as having a peak emission wavelength of from about 500 nm to about 550 nm. Emissions extending from about 550 nm to about 600 nm may be described as containing wavelengths that change from a yellow-green color to a yellow color. The addition of Gd doping converts the phosphor from a substantially green-emitting sample to a substantially yellow sample in the experiments described; though not shown, increasing the Gd concentration even further (from about 0.33 for Ba samples and from about 0.13 for Sr samples) shifts the emission further towards and into the yellow region of the electromagnetic spectrum. Making generalizations can be difficult because the peak emission wavelength depends not only on the choice and level of the rare earth(s) dopants present in addition to lutetium (e.g., Gd in addition to Lu), but also on the selection and amounts of the included alkaline earth(s) and the halogen(s). The halogenated aluminates in the present disclosure are defined to emit in the yellow-green to the yellow region of the electromagnetic spectrum, at wavelengths from about 550 nm to about 600 nm. Green-emitting halogenated aluminates emit at peak wavelengths ranging substantially from about 500 nm to about 550 nm. For green-emitting aluminates, see U.S. patent application Ser. No. 13/181,226 filed Jul. 12, 2011, assigned to the same assignee as the present application, and hereby incorporated herein in its entirety.

Figure 17A:
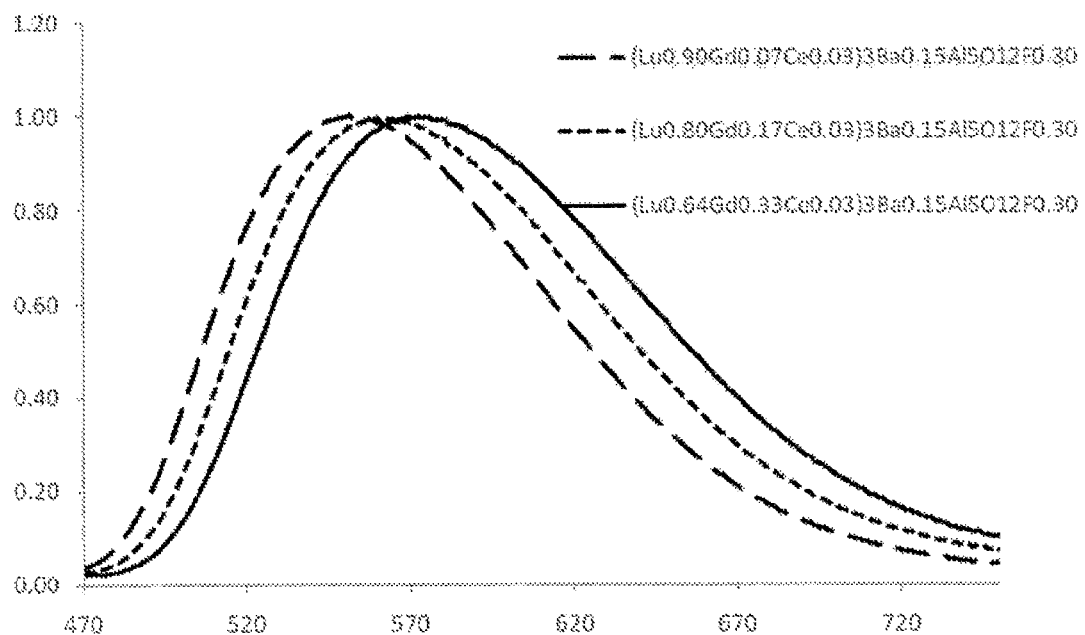
FIGS. 17A-B shows that the peak emission wavelength of these halogenated aluminates ranged overall from about 550 nm to about 580 nm as the Gd level was increased, where the Ba level was fixed stoichiometrically at 0.15 for the Ba series, and where the Sr level was fixed stoichiometrically at 0.34.
Figure 17B:
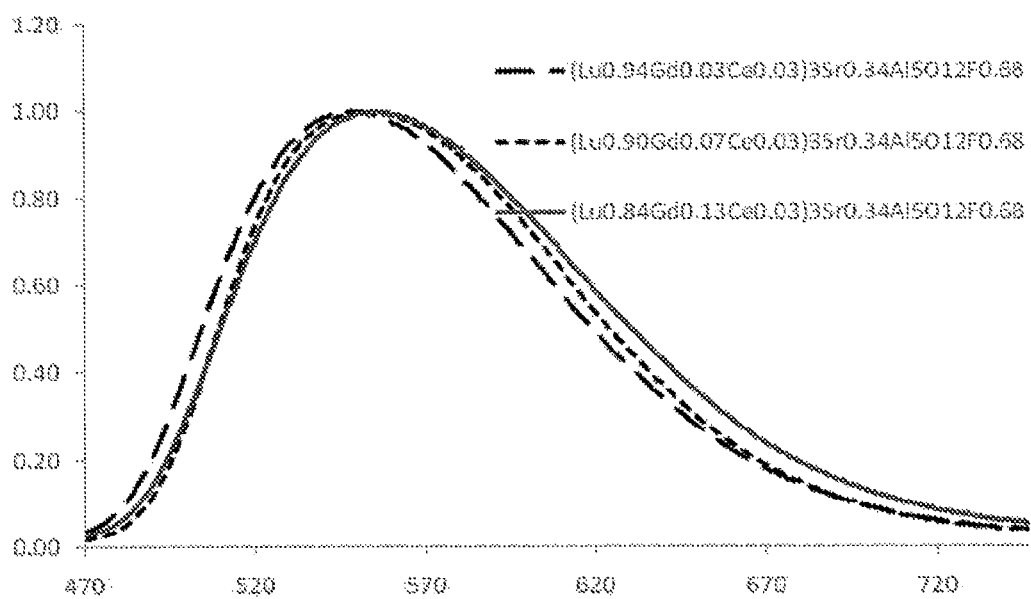

The data in FIGS. 16 and 17A-B shows that the peak emission wavelength of these halogenated aluminates ranged overall from about 550 nm to about 580 nm as the Gd level was increased, where the Ba level was fixed stoichiometrically at 0.15 for the Ba series, and where the Sr level was fixed stoichiometrically at 0.34 for the Sr series (the concentration is stoichiometric, meaning by number, not by weight). The Ce activator level was also fixed stoichiometrically at 0.03 for all of the samples. Specifically, for the Ba samples, the peak emission wavelength increased from 554 nm to 565 nm to 576 nm as the Gd amount was increased stoichiometrically from 0.07 to 0.17 to 0.33, respectively. For the Sr samples, the peak emission wavelength increased from 551 nm to 555 nm to 558 m as the Gd amount was increased stoichiometrically from 0.03 to 0.07 to 0.13, respectively.

The actual compounds m the Ba series were, respectively, $(Lu_{0.90}Gd_{0.07}Ce_{0.03})_3Ba_{0.15}Al_5O_{12}F_{0.30}$, $(Lu_{0.80}Gd_{0.17}Ce_{0.03})_3Ba_{0.15}Al_5O_{12}F_{0.30}$, and $(Lu_{0.64}Gd_{0.33}Ce_{0.03})_3Ba_{0.15}Al_5O_{12}F_{0.30}$. The actual compounds tested in the Sr series were, respectively, $(Lu_{0.94}Gd_{0.03}Ce_{0.03})_3Sr_{0.34}Al_5O_{12}F_{0.68}$, $(Lu_{0.90}Gd_{0.07}Ce_{0.03})_3Sr_{0.34}Al_5O_{12}F_{0.68}$, and $(Lu_{0.84}Gd_{0.13}Ce_{0.03})_3Sr_{0.34}Al_5O_{12}F_{0.68}$.

It is noted that the Sr series emitted at a higher relative photoluminescent intensity when compared to the Ba series, but one skilled in the art will know to draw conclusions carefully, as several other variables were changed at the same time (e.g., Gd content, alkaline earth amounts, and halogen concentrations).

Figure 18A:
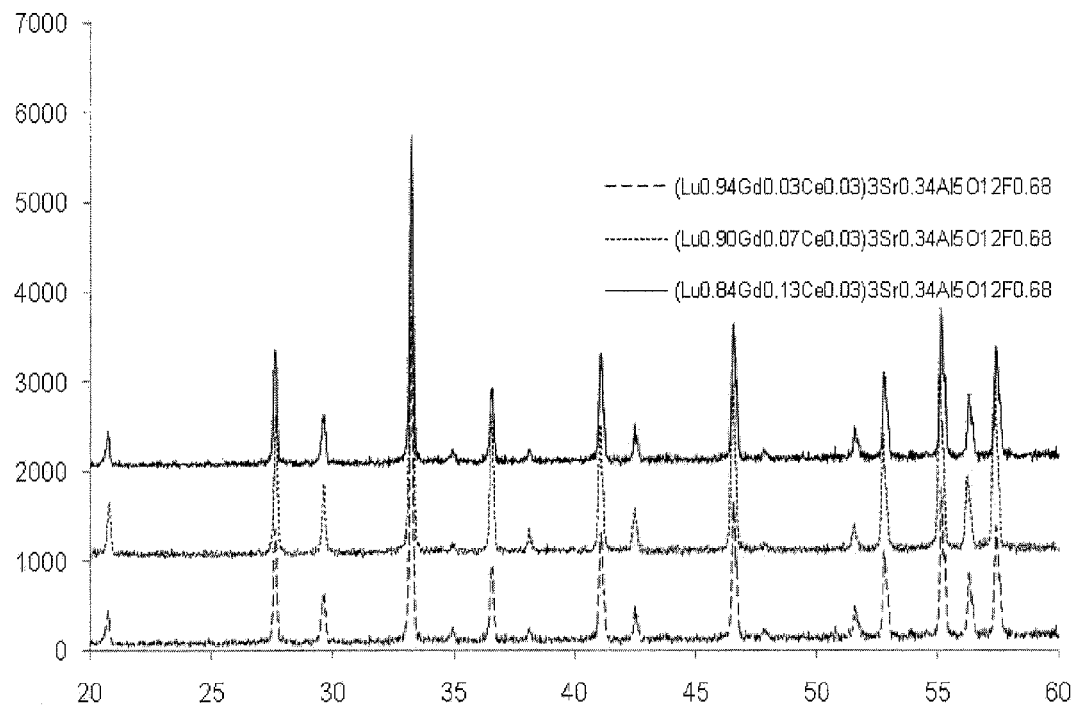
FIGS. 18A-B are the x-ray diffraction patterns of both the Ba series and the Sr series of phosphors whose luminosity data was depicted in FIGS. 17A-B.
Figure 18B:
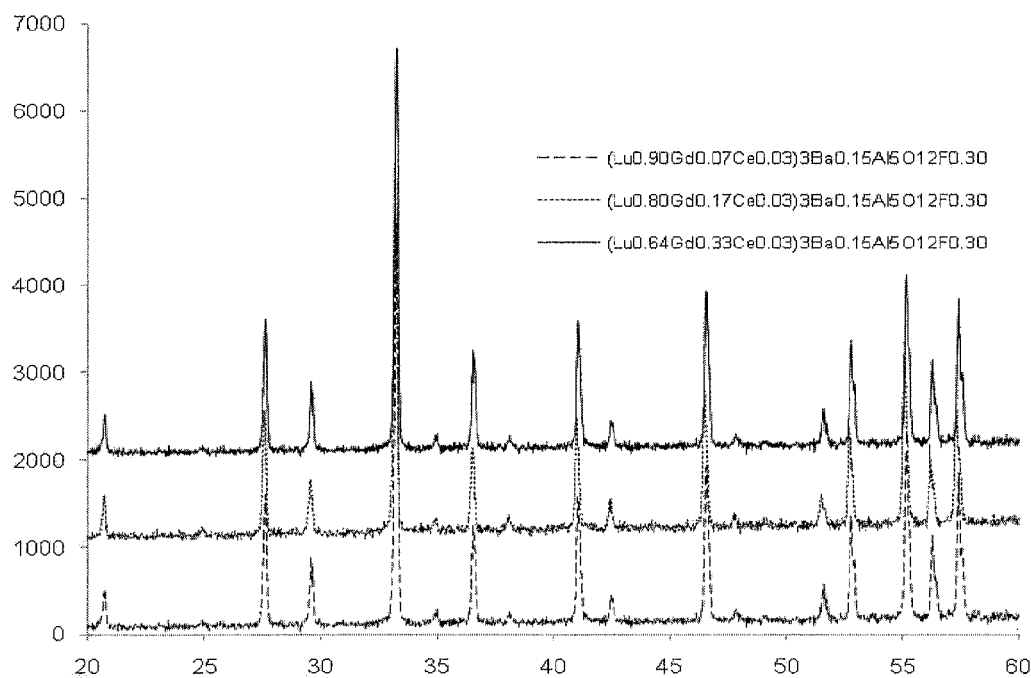

Shown in FIGS. 18A-B are the x-ray diffraction patterns of both the Ba series and the Sr series of phosphors whose luminosity data was depicted in FIGS. 17A-B.

Although the present embodiments and their advantages have been described in detail, it should be understood that various changes, substitutions, and alterations may be made without departing from the spirit and scope of the embodiments as defined by the appended claims.

TABLE 1

Testing results of $Lu_{2.91}Ce_{0.09}Al_5O_{12}$ with different $MgF_2$ levels of additive

| $MgF_2$ (wt %) | CIE x | CIE y | Emission Peak Wavelength (nm) | Relative Intensity (%) | Particle Size D50 (µm) |
|---|---|---|---|---|---|
| 1 | 0.3635 | 0.5862 | 526.88 | 58.04 | 4.01 |
| 2 | 0.3554 | 0.5778 | 529.56 | 78.47 | 7.38 |
| 3 | 0.3336 | 0.5776 | 514.22 | 105.13 | 9.30 |

TABLE 2

Testing results of $Lu_{2.91}Ce_{0.09}Al_5O_{12}$ with different levels of $SrF_2$ additive

| $SrF_2$ (wt %) | CIE x | CIE y | Emission Peak Wavelength (nm) | Relative Intensity (%) | Particle Size D50 (μm) |
|---|---|---|---|---|---|
| 1 | 0.3677 | 0.5732 | 534.64 | 71.65 | 3.84 |
| 2 | 0.3677 | 0.5732 | 534.64 | 85.82 | 5.24 |
| 3 | 0.3555 | 05718 | 532.43 | 112.40 | 9.90 |
| 5 | 0.3405 | 0.5748 | 523.44 | 107.67 | 11.38 |

What is claimed is:

1. A cerium-activated, yellow-green to yellow-emitting lutetium aluminate phosphor comprising lutetium, gadolinium, cerium, aluminum, oxygen, fluorine, and at least one of strontium and barium, wherein said at least one of strontium and barium and said fluorine are included in said phosphor in an amount of about 3 to 5 weight percent, and wherein said phosphor is configured to absorb excitation radiation having a wavelength ranging from about 380 nm to about 480 nm, and to emit light having a peak emission wavelength ranging from about 550 nm to about 580 nm.

2. The cerium-activated, yellow-green to yellow-emitting lutetium aluminate phosphor of claim 1, wherein said cerium-activated, yellow-green to yellow-emitting lutetium aluminate phosphor has a composition represented by a chemical formula selected from the group consisting of:
$(Lu_{0.94}Gd_{0.03}Ce_{0.03})_3Sr_{0.34}Al_5O_{12}F_{0.68}$;
$(Lu_{0.90}Gd_{0.07}Ce_{0.03})_3Sr_{0.34}Al_5O_{12}F_{0.68}$;
$(Lu_{0.84}Gd_{0.13}Ce_{0.03})_3Sr_{0.34}Al_5O_{12}F_{0.68}$;
$(Lu_{0.90}Gd_{0.07}Ce_{0.03})_3Ba_{0.15}Al_5O_{12}F_{0.30}$;
$(Lu_{0.80}Gd_{0.17}Ce_{0.03})_3Ba_{0.15}Al_5O_{12}F_{0.30}$; and
$(Lu_{0.64}Gd_{0.33}Ce_{0.03})_3Ba_{0.15}Al_5O_{12}F_{0.30}$.

3. The cerium-activated, yellow-green to yellow-emitting lutetium aluminate phosphor of claim 1, wherein said at least one of strontium and barium is strontium and wherein peak emission wavelength ranges from about 551 nm to 558 nm.

4. The cerium-activated, yellow-green to yellow-emitting lutetium aluminate phosphor of claim 3, wherein said cerium-activated, yellow-green to yellow-emitting lutetium aluminate phosphor has a composition represented by a chemical formula selected from the group consisting of:
$(Lu_{0.94}Gd_{0.03}Ce_{0.03})_3Sr_{0.34}Al_5O_{12}F_{0.68}$;
$(Lu_{0.90}Gd_{0.07}Ce_{0.03})_3Sr_{0.34}Al_5O_{12}F_{0.68}$; and
$(Lu_{0.84}Gd_{0.13}Ce_{0.03})_3Sr_{0.34}Al_5O_{12}F_{0.68}$.

5. The cerium-activated, yellow-green to yellow-emitting lutetium aluminate phosphor of claim 1, wherein said at least one of strontium and barium is barium and wherein said peak emission wavelength ranges from about 554 nm to 576 nm.

6. The cerium-activated, yellow-green to yellow-emitting lutetium aluminate phosphor of claim 5, wherein said cerium-activated, yellow-green to yellow-emitting lutetium aluminate phosphor has a composition represented by a chemical formula selected from the group consisting of:
$(Lu_{0.90}Gd_{0.07}Ce_{0.03})_3Ba_{0.15}Al_5O_{12}F_{0.30}$;
$(Lu_{0.80}Gd_{0.17}Ce_{0.03})_3Ba_{0.15}Al_5O_{12}F_{0.30}$; and
$(Lu_{0.64}Gd_{0.33}Ce_{0.03})_3Ba_{0.15}Al_5O_{12}F_{0.30}$.

7. The cerium-activated, yellow-green to yellow-emitting lutetium aluminate phosphor of claim 1, wherein said excitation radiation has a wavelength ranging from about 420 nm to about 480 nm.

8. The cerium-activated, yellow-green to yellow-emitting lutetium aluminate phosphor of claim 7, wherein said stoichiometric ratio of said fluorine to said at least one of strontium and barium is about 2.

9. The cerium-activated, yellow-green to yellow-emitting lutetium aluminate phosphor of claim 7, wherein said stoichiometric ratio of said fluorine to said at least one of strontium and barium is less than 2 and greater than or equal to 1.

10. A cerium-activated, yellow-green to yellow-emitting lutetium aluminate phosphor comprising lutetium, gadolinium, cerium, aluminum, oxygen, fluorine, and at least one of strontium and barium, wherein said phosphor is configured to absorb excitation radiation having a wavelength ranging from about 380 nm to about 480 nm, and to emit light having a peak emission wavelength ranging from about 550 nm to about 600 nm, wherein said phosphor is characterized by CIE(x) coordinates ranging from 0.413 to 0.48 and CIE(y) coordinates ranging from 0.505 to 0.55.

11. The cerium-activated, yellow-green to yellow-emitting lutetium aluminate phosphor of claim 10, wherein said at least one of strontium and barium is strontium and wherein said phosphor is characterized by CIE(x) coordinates ranging from 0.413 to 0.436 and CIE(y) coordinates ranging from 0.537 to 0.55.

12. The cerium-activated, yellow-green to yellow-emitting lutetium aluminate phosphor of claim 11, wherein said phosphor is configured to emit light having a peak emission wavelength ranging from about 551 nm to 558 nm.

13. The cerium-activated, yellow-green to yellow-emitting lutetium aluminate phosphor of claim 11, wherein said cerium-activated, yellow-green to yellow-emitting lutetium aluminate phosphor has a composition represented by a chemical formula selected from the group consisting of:
$(Lu_{0.94}Gd_{0.03}Ce_{0.03})_3Sr_{0.34}Al_5O_{12}F_{0.68}$;
$(Lu_{0.90}Gd_{0.07}Ce_{0.03})_3Sr_{0.34}Al_5O_{12}F_{0.68}$; and
$(LU_{0.84}Gd_{0.13}Ce_{0.03})_3Sr_{0.34}Al_5O_{12}F_{0.68}$.

14. The cerium-activated, yellow-green to yellow-emitting lutetium aluminate phosphor of claim 10, wherein said at least one of strontium and barium is barium and wherein said yellow-green to yellow-emitting lutetium aluminate phosphor is characterized by CIE(x) coordinates ranging from 0.424 to 0.48 and CIE(y) coordinates ranging from 0.505 to 0,543.

15. The cerium-activated, yellow-green to yellow-emitting lutetium aluminate phosphor of claim 14, wherein said phosphor is configured to emit light having a peak emission wavelength ranging from about 554 nm to 576 nm.

16. The cerium-activated, yellow-green to yellow-emitting lutetium aluminate phosphor of claim 14, wherein said cerium-activated, yellow-green to yellow-emitting lutetium aluminate phosphor has a composition represented by a chemical formula selected from the group consisting of:
$(Lu_{0.90}Gd_{0.07}Ce_{0.03})_3Ba_{0.15}Al_5O_{12}F_{0.30}$;
$(Lu_{0.80}Gd_{0.17}Ce_{0.03})_3Ba_{0.15}Al_5O_{12}F_{0.30}$; and
$(Lu_{0.64}Gd_{0.33}Ce_{0.03})_3Ba_{0.15}Al_5O_{12}F_{0.30}$.

17. The cerium-activated, yellow-green to yellow-emitting lutetium aluminate phosphor of claim 10, wherein said excitation radiation has a wavelength ranging from about 420 nm to about 480 nm.

18. The cerium-activated, yellow-green to yellow-emitting lutetium aluminate phosphor of claim 10, wherein said cerium-activated, yellow-green to yellow-emitting lutetium aluminate phosphor has a composition represented by a chemical formula selected from the group consisting of:
$(Lu_{0.94}Gd_{0.03}Ce_{0.03})_3Sr_{0.34}Al_5O_{12}F_{0.68}$;
$(Lu_{0.90}Gd_{0.07}Ce_{0.03})_3Sr_{0.34}Al_5O_{12}F_{0.68}$;
$(LU_{0.84}Gd_{0.13}Ce_{0.03})_3Sr_{0.34}Al_5O_{12}F_{0.68}$;
$(Lu_{0.90}Gd_{0.07}Ce_{0.03})_3Ba_{0.15}Al_5O_{12}F_{0.30}$;
$(Lu_{0.80}Gd_{0.17}Ce_{0.03})_3Ba_{0.15}Al_5O_{12}F_{0.30}$; and
$(Lu_{0.64}Gd_{0.33}Ce_{0.03})_3Ba_{0.15}Al_5O_{12}F_{0.30}$.

19. A cerium-activated, yellow-green to yellow-emitting lutetium aluminate phosphor comprising lutetium, gadolinium, cerium, aluminum, oxygen, fluorine, and at least one of strontium and barium, wherein said phosphor is configured to absorb excitation radiation having a wavelength ranging from about 380 nm to about 480 nm, and to emit light having a peak emission wavelength ranging from about 550 nm to about 580 nm, and wherein said phosphor is a crystalline material characterized by 2θ x-ray diffraction peaks including at least peaks at about 27.5, 29.5, 33.0, 36.5, 41.0, 46.5, 53.0, 56.5 and 57.5 degrees.

20. The cerium-activated, yellow-green to yellow-emitting lutetium aluminate phosphor of claim 19, wherein said excitation radiation has a wavelength ranging from about 420 nm to about 480 nm.

21. The cerium-activated, yellow-green to yellow-emitting lutetium aluminate phosphor of claim 19, wherein said cerium-activated, yellow-green to yellow-emitting lutetium aluminate phosphor has a composition represented by a chemical formula selected from the group consisting of:

$(Lu_{0.94}Gd_{0.03}Ce_{0.03})_3Sr_{0.34}Al_5O_{12}F_{0.68}$;
$(Lu_{0.90}Gd_{0.07}Ce_{0.03})_3Sr_{0.34}Al_5O_{12}F_{0.68}$;
$(Lu_{0.84}Gd_{0.13}Ce_{0.03})_3Sr_{0.34}Al_5O_{12}F_{0.68}$;
$(Lu_{0.90}Gd_{0.07}Ce_{0.03})_3Ba_{0.15}Al_5O_{12}F_{0.30}$;
$(Lu_{0.80}Gd_{0.17}Ce_{0.03})_3Ba_{0.15}Al_5O_{12}F_{0.30}$; and
$(Lu_{0.64}Gd_{0.33}Ce_{0.03})_3Ba_{0.15}Al_5O_{12}F_{0.30}$.

* * * * *